US012642082B2

(12) United States Patent
Wei

(10) Patent No.: US 12,642,082 B2
(45) Date of Patent: May 26, 2026

(54) CUTTING STRUCTURE, SEMICONDUCTOR DEVICE COMPRISING THE SAME, AND METHOD FOR FABRICATING THE SAME

(71) Applicant: NANYA TECHNOLOGY CORPORATION, New Taipei City (TW)

(72) Inventor: Chun-Yen Wei, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 392 days.

(21) Appl. No.: 18/536,622

(22) Filed: Dec. 12, 2023

(65) Prior Publication Data

US 2025/0157924 A1 May 15, 2025

Related U.S. Application Data

(62) Division of application No. 18/508,568, filed on Nov. 14, 2023.

(51) Int. Cl.
H10W 20/41 (2026.01)
H10P 50/00 (2026.01)
(Continued)

(52) U.S. Cl.
CPC ......... H10W 20/435 (2026.01); H10P 50/287 (2026.01); H10P 50/71 (2026.01); H10P 76/2041 (2026.01); H10W 20/089 (2026.01)

(58) Field of Classification Search
CPC ........ H10P 50/287; H10P 50/71; H10P 54/00; H10P 76/2041; H10W 20/089; H10W 20/435
See application file for complete search history.

(56) References Cited

U.S. PATENT DOCUMENTS

2009/0029521 A1 1/2009 Sheen et al.
2018/0261601 A1* 9/2018 Kim ..................... H10B 12/315
(Continued)

FOREIGN PATENT DOCUMENTS

CN 110896046 A 3/2020
EP 4220699 A1 8/2023
(Continued)

OTHER PUBLICATIONS

Office Action and and the search report mailed on Jan. 15, 2025 related to Taiwanese Application No. 113101295.
(Continued)

*Primary Examiner* — Shaun M Campbell
(74) *Attorney, Agent, or Firm* — Xuan Zhang

(57) ABSTRACT

The present application discloses a cutting structure, a semiconductor device with the cutting structure, and a method for fabricating the semiconductor device. The cutting structure includes two primary cutting insulating layers positioned on two ends of a secondary cutting insulating layer and extending upwardly, wherein the two primary cutting insulating layers and the secondary cutting insulating layer together configure a U-shaped cross-sectional profile; a conductive portion positioned on the secondary cutting insulating layer and laterally surrounded by the two primary cutting insulating layers; and a capping portion positioned on the conductive portion and laterally surrounded by the two primary cutting insulating layers.

12 Claims, 24 Drawing Sheets

(51) Int. Cl.

| | |
|---|---|
| *H10P 50/28* | (2026.01) |
| *H10P 76/20* | (2026.01) |
| *H10W 20/00* | (2026.01) |

(56) References Cited

U.S. PATENT DOCUMENTS

| | | | | |
|---|---|---|---|---|
| 2019/0148221 A1* | 5/2019 | Peng | .......... | H10P 76/4085 |
| | | | | 257/758 |
| 2021/0351189 A1 | 11/2021 | Luo et al. | | |
| 2022/0102212 A1* | 3/2022 | Su | .......... | H10W 20/069 |
| 2022/0334473 A1* | 10/2022 | Chen | .......... | G03F 7/0035 |
| 2022/0344478 A1* | 10/2022 | Hsiao | .......... | H10D 64/01 |
| 2023/0054358 A1 | 2/2023 | Wu et al. | | |
| 2023/0335491 A1 | 10/2023 | Tung et al. | | |
| 2024/0387366 A1* | 11/2024 | Lin | .......... | H10W 10/011 |
| 2024/0413008 A1* | 12/2024 | Huang | .......... | H10W 20/46 |

FOREIGN PATENT DOCUMENTS

| | | |
|---|---|---|
| TW | 202109661 A | 3/2021 |
| TW | 202117977 A | 5/2021 |
| TW | 202322370 A | 6/2023 |

OTHER PUBLICATIONS

Summary translation of Office Action and and the search report mailed on Jan. 15, 2025 related to Taiwanese Application No. 113101295.

Office Action and and the search report mailed on Apr. 9, 2025 related to Taiwanese Application No. 113121198.

Notice of Allowance and and the search report mailed on May 14, 2025 related to Taiwanese Application No. 113121198.

Summary translation of Office Action and and the search report mailed on Apr. 9, 2025 related to Taiwanese Application No. 113121198 and Summary translation of Notice of Allowance and and the search report mailed on May 14, 2025 related to Taiwanese Application No. 113121198.

\* cited by examiner

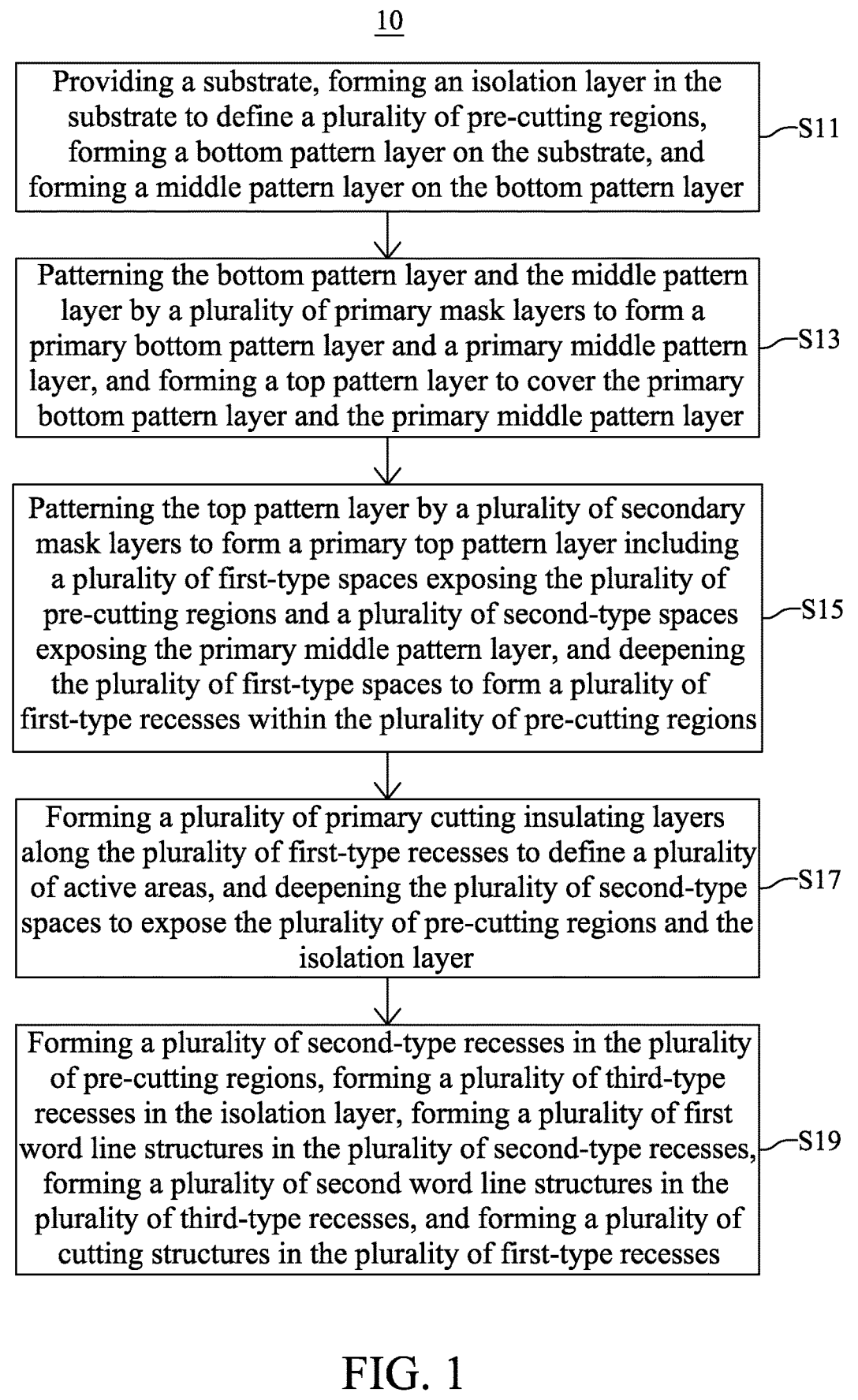

10

Providing a substrate, forming an isolation layer in the substrate to define a plurality of pre-cutting regions, forming a bottom pattern layer on the substrate, and forming a middle pattern layer on the bottom pattern layer — S11

Patterning the bottom pattern layer and the middle pattern layer by a plurality of primary mask layers to form a primary bottom pattern layer and a primary middle pattern layer, and forming a top pattern layer to cover the primary bottom pattern layer and the primary middle pattern layer — S13

Patterning the top pattern layer by a plurality of secondary mask layers to form a primary top pattern layer including a plurality of first-type spaces exposing the plurality of pre-cutting regions and a plurality of second-type spaces exposing the primary middle pattern layer, and deepening the plurality of first-type spaces to form a plurality of first-type recesses within the plurality of pre-cutting regions — S15

Forming a plurality of primary cutting insulating layers along the plurality of first-type recesses to define a plurality of active areas, and deepening the plurality of second-type spaces to expose the plurality of pre-cutting regions and the isolation layer — S17

Forming a plurality of second-type recesses in the plurality of pre-cutting regions, forming a plurality of third-type recesses in the isolation layer, forming a plurality of first word line structures in the plurality of second-type recesses, forming a plurality of second word line structures in the plurality of third-type recesses, and forming a plurality of cutting structures in the plurality of first-type recesses — S19

FIG. 1

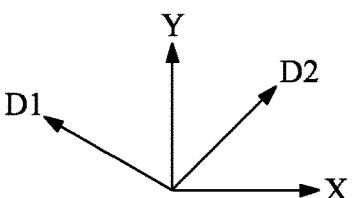
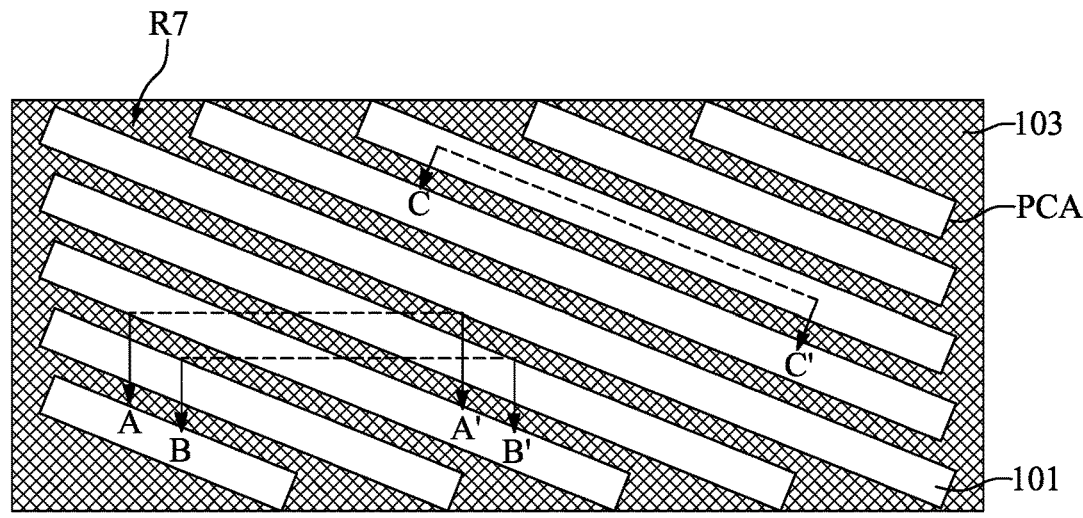
FIG. 2

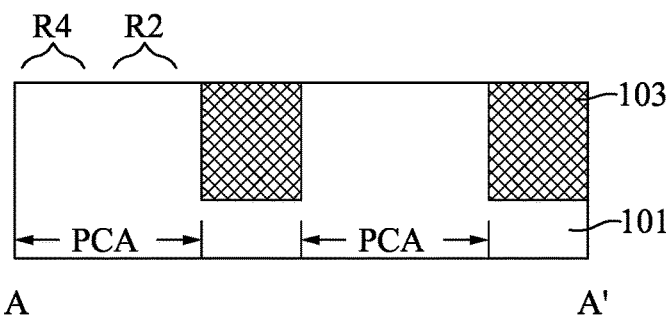
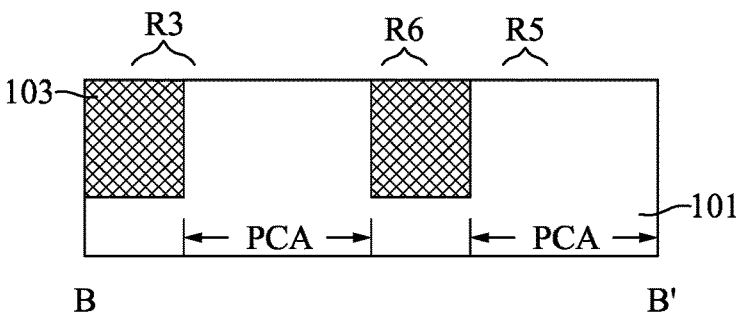
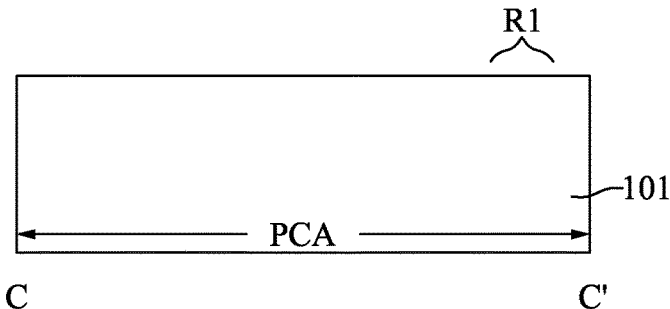
FIG. 3

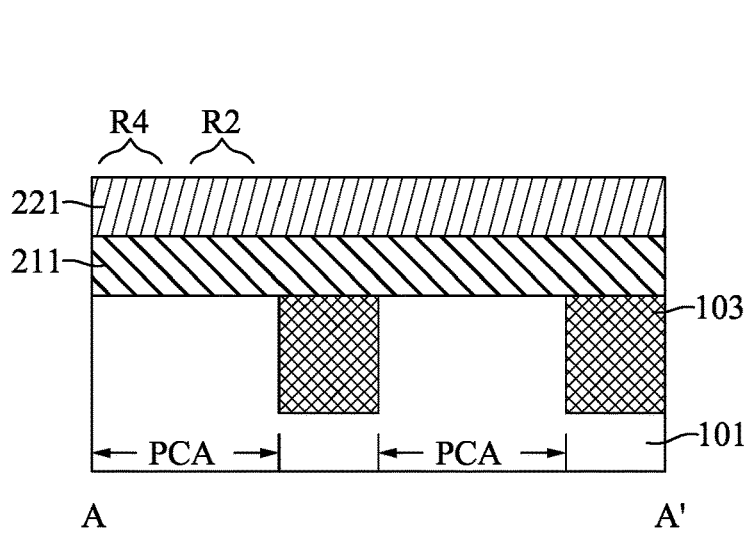
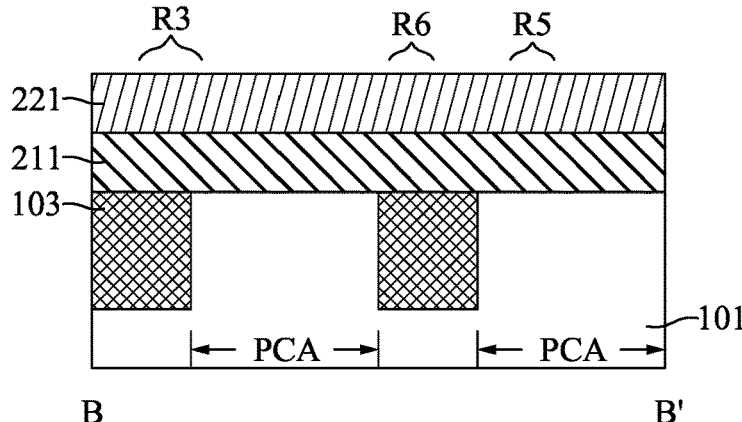
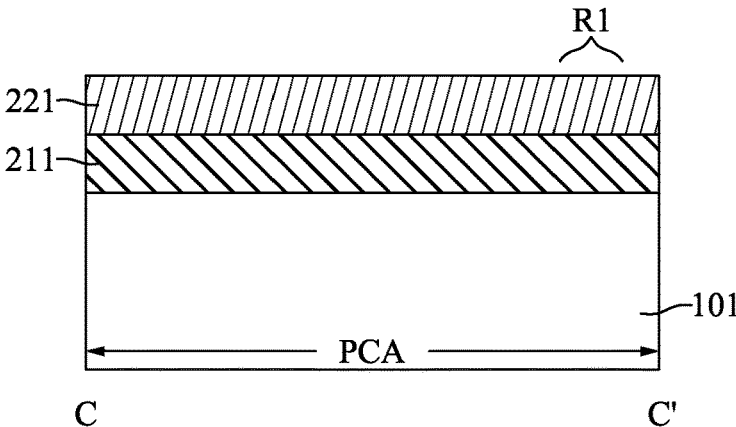
FIG. 4

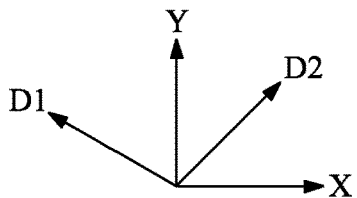
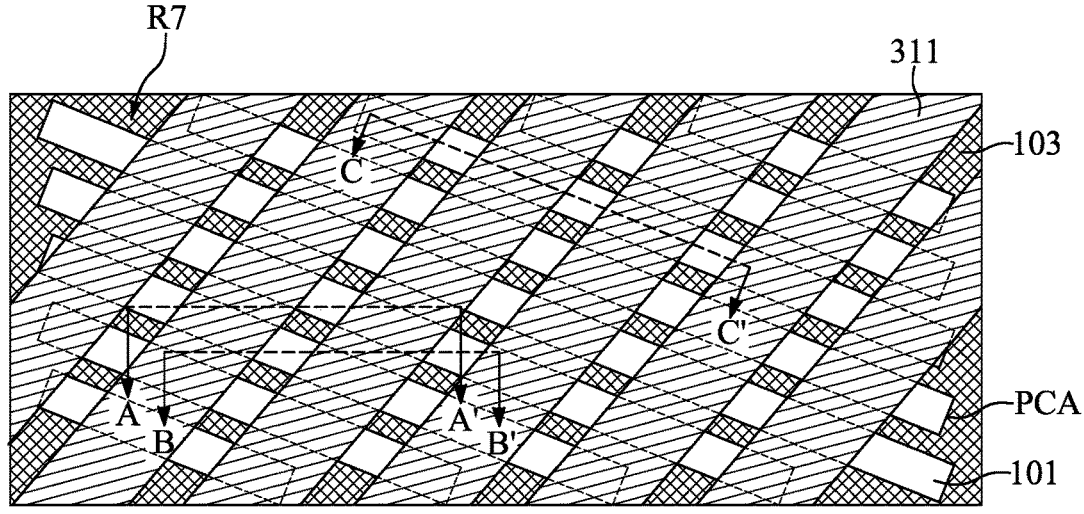
FIG. 5

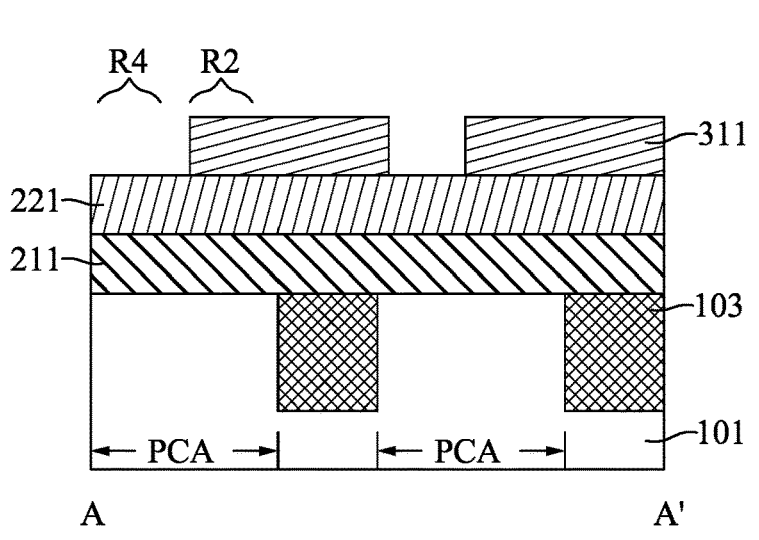
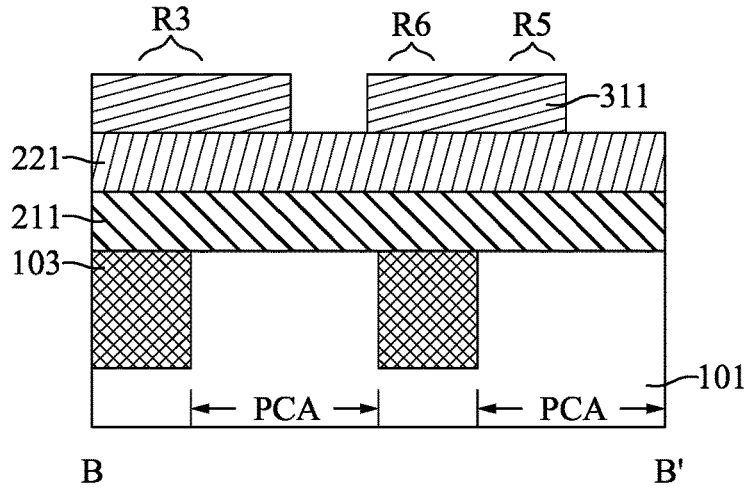
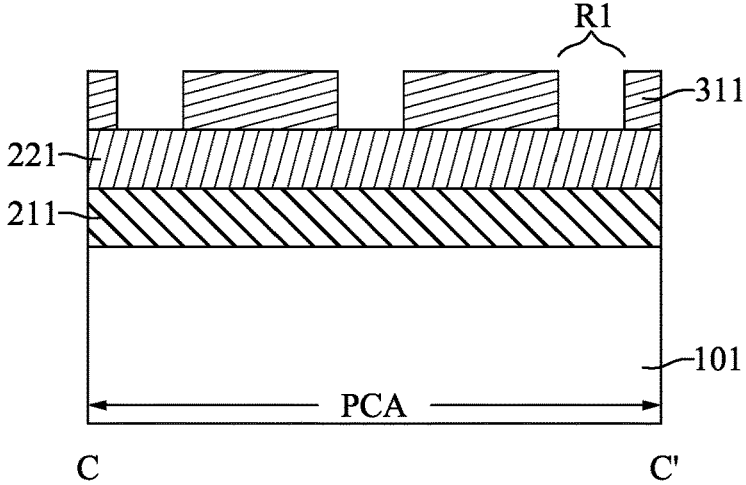
FIG. 6

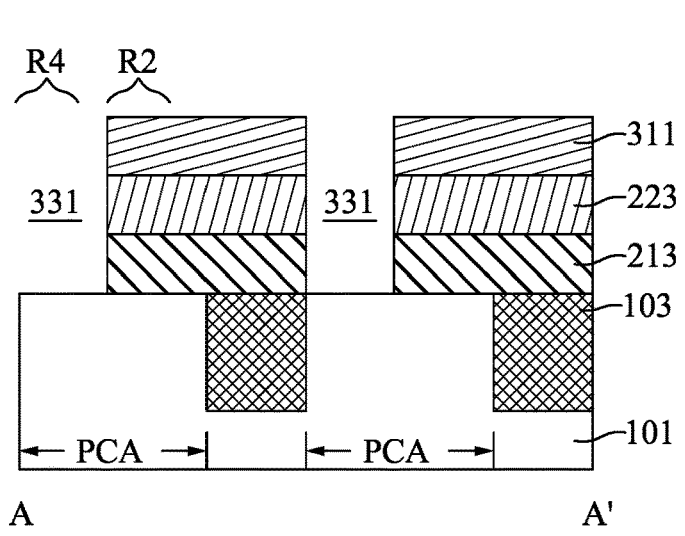
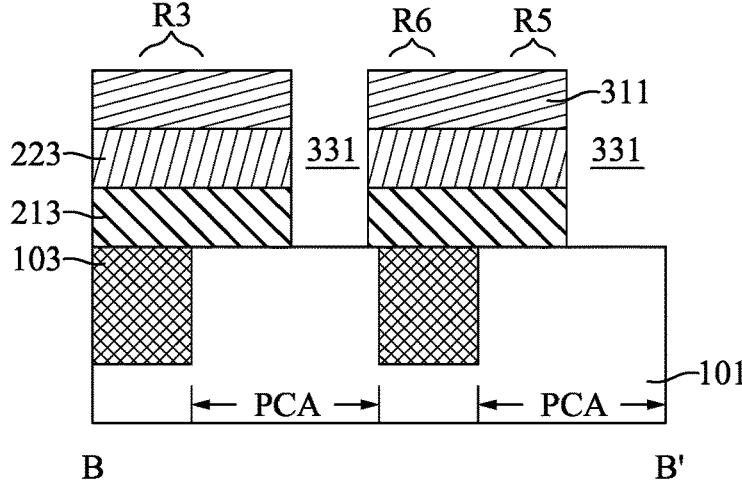
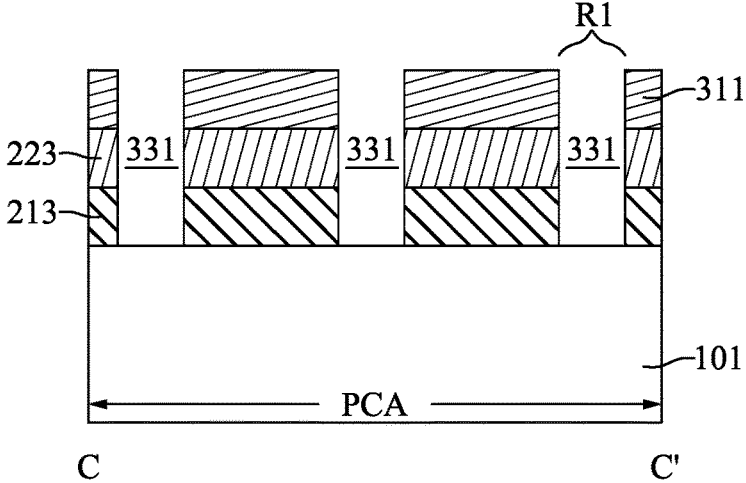
FIG. 7

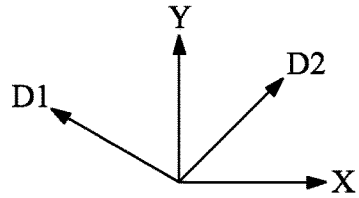
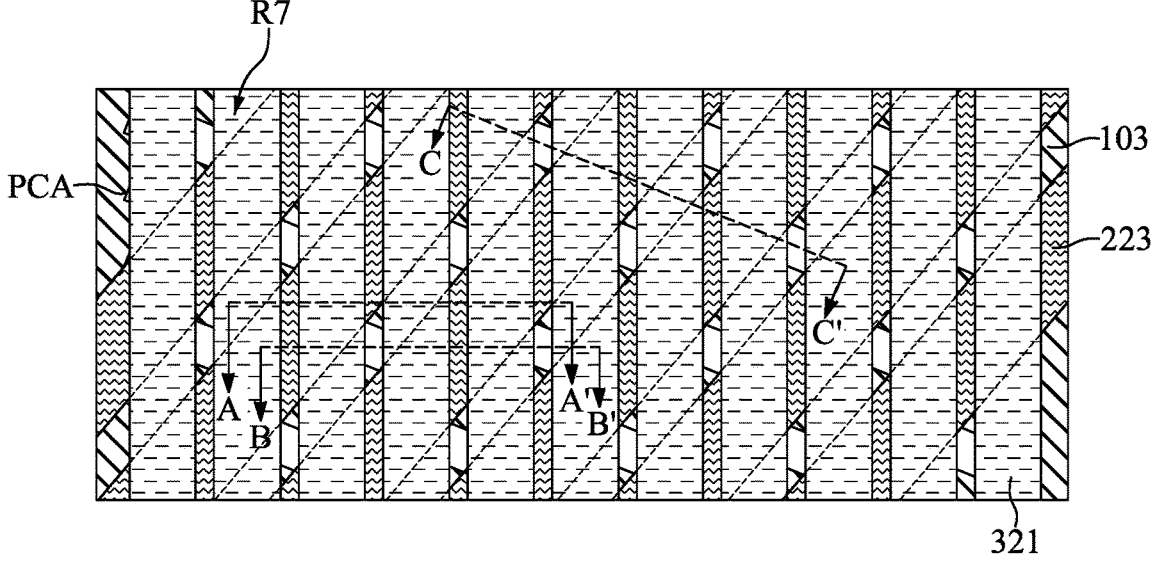
FIG. 9

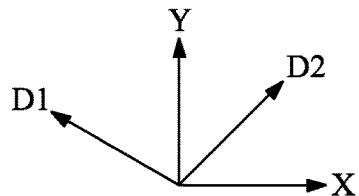
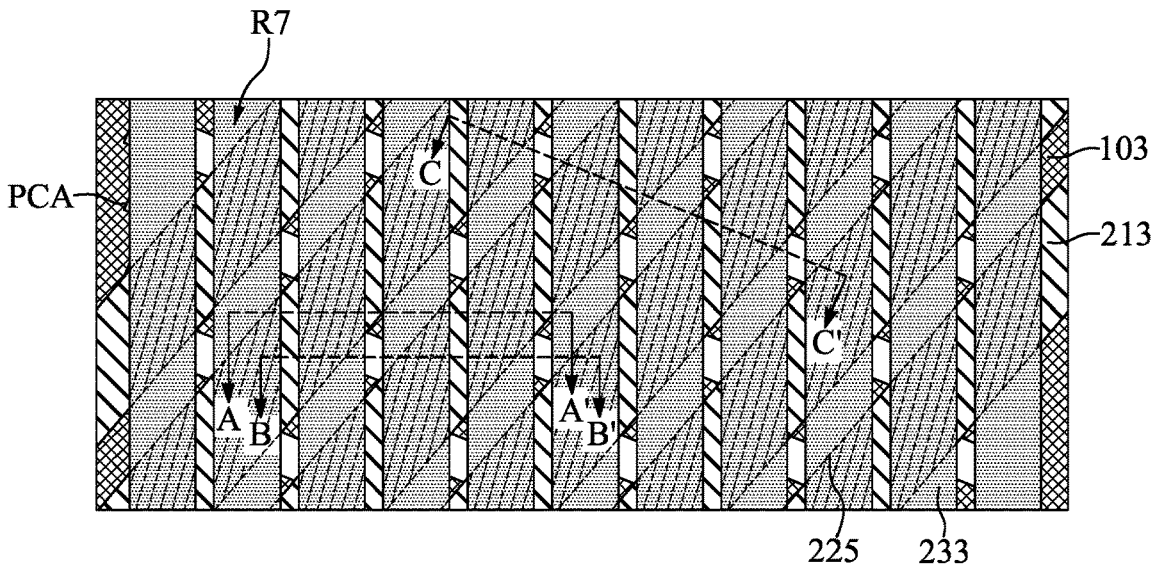
FIG. 12

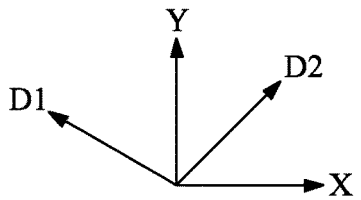
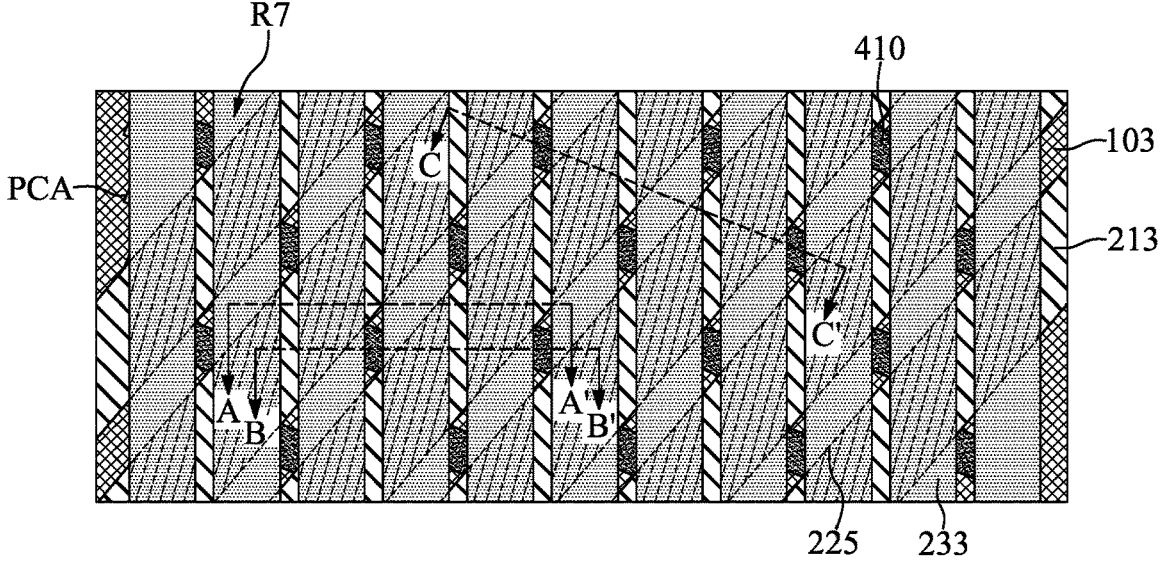
FIG. 14

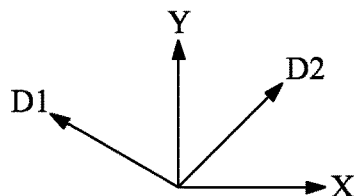
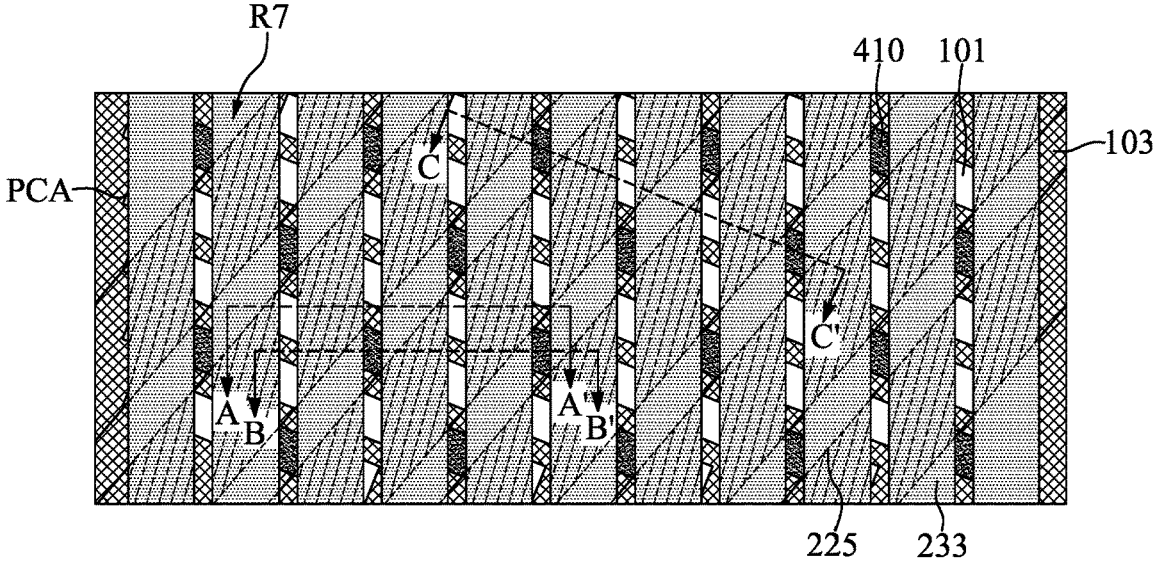
FIG. 16

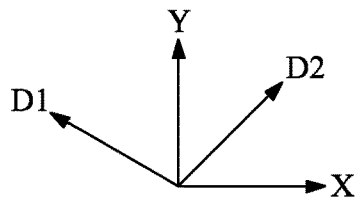
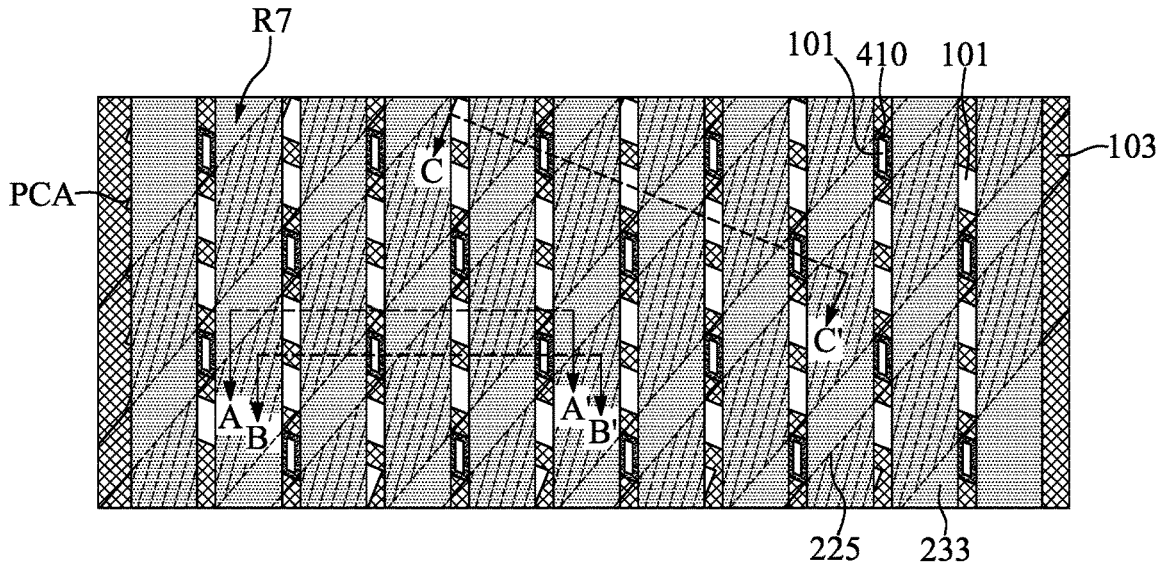
FIG. 18

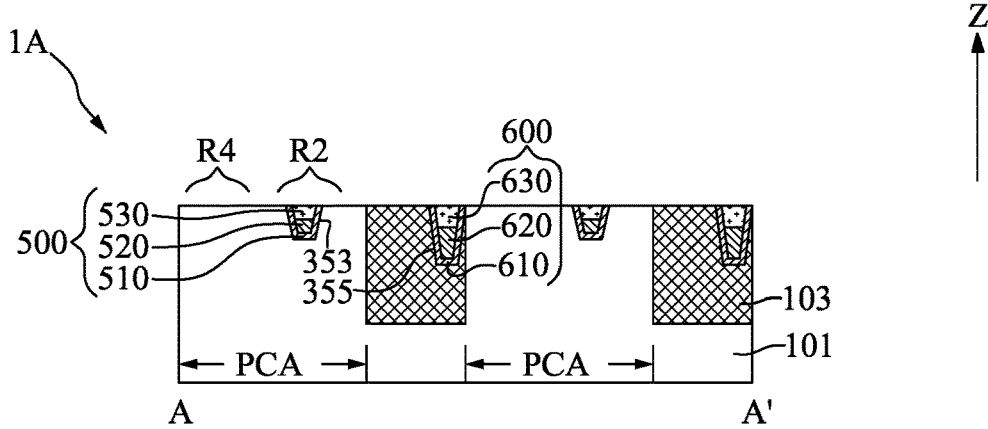
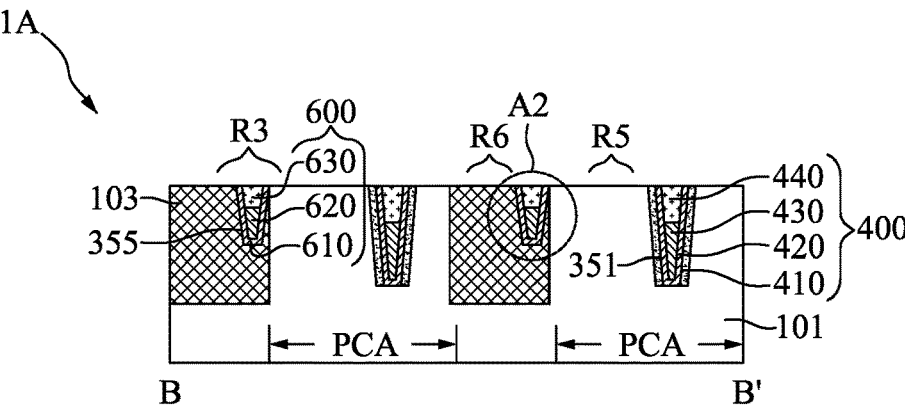
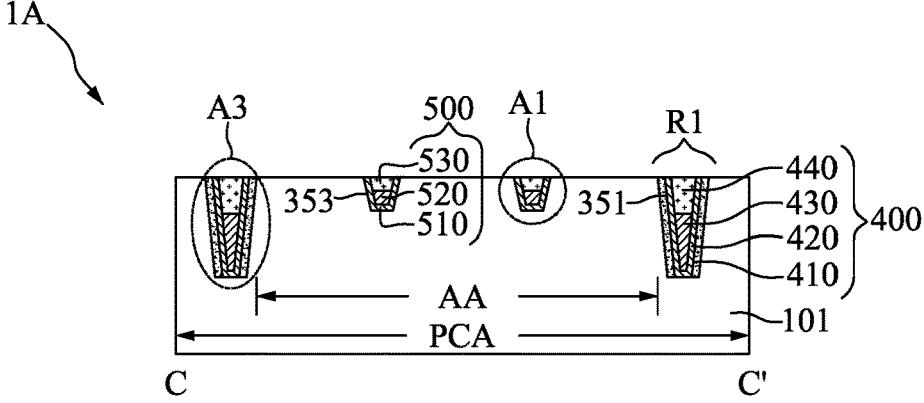
FIG. 21

FIG. 24

CUTTING STRUCTURE, SEMICONDUCTOR DEVICE COMPRISING THE SAME, AND METHOD FOR FABRICATING THE SAME

CROSS-REFERENCE TO RELATED APPLICATION

This application is a divisional application of U.S. Non-Provisional application Ser. No. 18/508,568 filed Nov. 14, 2023, which is incorporated herein by reference in its entirety.

TECHNICAL FIELD

The present disclosure relates to a cutting structure, a semiconductor device, and a method for fabricating the semiconductor device, and more particularly, to a semiconductor device with the cutting structure, and method for fabricating the semiconductor device with the cutting structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a cutting structure including two primary cutting insulating layers positioned on two ends of a secondary cutting insulating layer and extending upwardly, wherein the two primary cutting insulating layers and the secondary cutting insulating layer together configure a U-shaped cross-sectional profile; a conductive portion positioned on the secondary cutting insulating layer and laterally surrounded by the two primary cutting insulating layers; and a capping portion positioned on the conductive portion and laterally surrounded by the two primary cutting insulating layers.

Another aspect of the present disclosure provides a semiconductor device including an isolation layer positioned in a substrate to define a pre-cutting area along a first tilt direction in a top-view perspective; at least two cutting structures positioned in the pre-cutting area and respectively comprising two primary cutting insulating layers positioned on two ends of a secondary cutting insulating layer and extending upwardly, a conductive portion positioned on the secondary cutting insulating layer and laterally surrounded by the two primary cutting insulating layers, and a capping portion positioned on the conductive portion and laterally surrounded by the two primary cutting insulating layers. The two primary cutting insulating layers and the secondary cutting insulating layer together configure a U-shaped cross-sectional profile. An active area is defined within the pre-cutting area by an adjacent pair of the cutting structures.

Another aspect of the present disclosure provides a method for fabricating a semiconductor device including forming an isolation layer in a substrate to define a pre-cutting area, which extends along a first tilt direction in a top-view perspective, forming a bottom pattern layer on the substrate, and forming a middle pattern layer on bottom pattern layer; patterning the bottom pattern layer and the middle pattern layer using a primary mask layer, which extends along a second tilt direction in a top-view perspective, resulting in a primary bottom pattern layer and a primary middle pattern layer, which expose the pre-cutting area; forming a top pattern layer to cover the primary bottom pattern layer, the primary middle pattern layer, and the pre-cutting area; patterning the top pattern layer using a secondary mask layer, which extends along a first direction intersecting both the first tilt direction and the second tilt direction, resulting in a primary top pattern layer comprising at least two first-type spaces exposing the pre-cutting area and a second-type space exposing the primary middle pattern layer; and deepening the first-type spaces to form at least two first-type recesses in the pre-cutting area and forming at least two cutting structures in the first-type recesses. The first tilt direction intersects with the second tilt direction and an active area is defined within the pre-cutting area by an adjacent pair of the cutting structures.

Due to the design of the semiconductor device of the present disclosure, the formation of the cutting structures and the active areas may be integrated with the formation of the word line structures. This integration reduces the complexity and cost of fabricating the semiconductor devices. Additionally, by meticulously controlling the process parameters for the primary cutting insulating layers and the secondary cutting insulating layers, well-controlled insulation capability of the cutting structures may be achieved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

FIG. 2 illustrates, in a schematic top-view diagram, an intermediate semiconductor device in accordance with one embodiment of the present disclosure;

FIGS. 3 and 4 are schematic cross-sectional view diagrams taken along lines A-A', B-B', and C-C' in FIG. 2;

FIG. 5 illustrates, in a schematic top-view diagram, an intermediate semiconductor device in accordance with one embodiment of the present disclosure;

FIGS. 6 to 8 are schematic cross-sectional view diagrams taken along lines A-A', B-B', and C-C' in FIG. 5;

FIG. 9 illustrates, in a schematic top-view diagram, an intermediate semiconductor device in accordance with one embodiment of the present disclosure;

FIG. 12 illustrates, in a schematic top-view diagram, an intermediate semiconductor device in accordance with one embodiment of the present disclosure;

FIG. 14 illustrates, in a schematic top-view diagram, an intermediate semiconductor device in accordance with one embodiment of the present disclosure;

FIG. 16 illustrates, in a schematic top-view diagram, an intermediate semiconductor device in accordance with one embodiment of the present disclosure;

FIG. 18 illustrates, in a schematic top-view diagram, an intermediate semiconductor device in accordance with one embodiment of the present disclosure;

FIGS. 19 to 21 are schematic cross-sectional view diagrams taken along lines A-A', B-B', and C-C' in FIG. 18;

FIGS. 23 and 24 illustrate, in schematic close-up cross-sectional view diagrams, semiconductor devices in accordance with some embodiments of the present disclosure.

DETAILED DESCRIPTION

Figure 8:
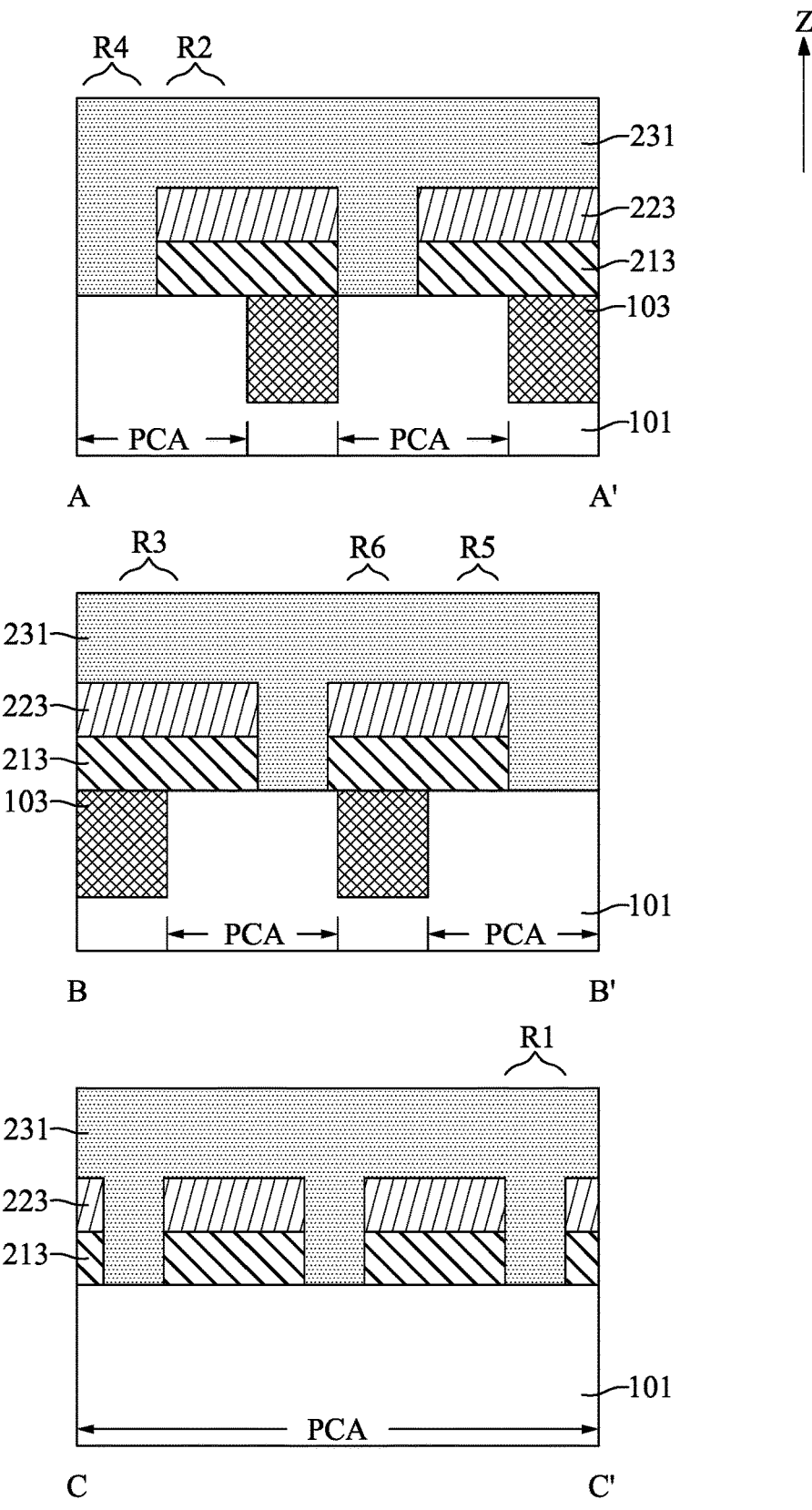

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIGS. 3 and 4 are schematic cross-sectional view diagrams taken along lines A-A', B-B', and C-C' in FIG. 2 illustrating part of the flow for fabricating the semiconductor device 1A in accordance with one embodiment of the present disclosure.

With reference to FIGS. 1 to 4, at step S11, a substrate 101 may be provided, an isolation layer 103 may be formed in the substrate 101 to define a plurality of pre-cutting regions PCA, a bottom pattern layer 211 may be formed on the substrate 101, and a middle pattern layer 221 may be formed on the bottom pattern layer 211.

With reference to FIGS. 2 and 3, the substrate 101 may include a bulk semiconductor substrate. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

With reference to FIGS. 2 and 3, an isolation layer 103 may be formed in the substrate 101. A series of deposition processes may be performed to deposit a pad oxide layer (not shown) and a pad nitride layer (not shown) on the substrate 101. A photolithography process and a subsequent etching process, such as an anisotropic dry etching process, may be performed to form trenches penetrating through the pad oxide layer, the pad nitride layer, and extending to the substrate 101. An insulating material may be deposited into the trenches and a planarization process, such as chemical mechanical polishing, may be subsequently performed until the top surface of the substrate 101 is exposed to remove excess filling material, provide a substantially flat surface for subsequent processing steps, and concurrently form the isolation layer 103. The insulating material may be, for example, silicon oxide or other applicable insulating materials.

The isolation layer 103 may define the plurality of pre-cutting regions PCA of the substrate 101. In some embodiments, each of the plurality of pre-cutting regions PCA may be a linear cross-sectional profile and may extend along a first tilt direction D1 in a top-view perspective. That is, in a top-view perspective, the plurality of pre-cutting regions PCA may manifest a series of linear cross-sectional profiles, each extending along the first tilt direction D1 and spaced apart from one and other. The first tilt direction D1 may intersect with the direction Y (also referred to as the first direction) and the direction X (also referred to as the second direction).

In subsequent processes, various regions may exhibit distinct film compositions or features. Thus, the regions R1, R2, R3, R4, R5, R6, R7 are elaborated upon to illustrate the differing film compositions or characteristics observed in the following stages.

With reference to FIGS. 2 and 3, the plurality of pre-cutting regions PCA may be exposed in the regions R1, R2, R4, R5. The isolation layer 103 may be exposed in the regions R3, R6, R7.

With reference to FIG. 4, the bottom pattern layer 211 may be blanket formed on the substrate 101 to cover the plurality of pre-cutting regions PCA and the isolation layer 103. In some embodiments, the bottom pattern layer 211 may be formed of a material having etching selectivity to the substrate 101 and the isolation layer 103. In some embodiments, the bottom pattern layer 211 may be formed of, for example, silicon nitride, boron nitride, silicon boron nitride, phosphorus boron nitride, boron carbon silicon nitride, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the bottom pattern layer 211 may be formed by, for example, chemical vapor deposition, physical vapor deposition, or other applicable deposition processes.

With reference to FIG. 4, the middle pattern layer 221 may be blanket formed on the bottom pattern layer 211. In some embodiments, the middle pattern layer 221 may be formed of a material having etching selectivity to the bottom pattern layer 211. In some embodiments, the middle pattern layer 221 may be formed of a material having etching selectivity to the bottom pattern layer 211, the substrate 101, and the isolation layer 103. In some embodiments, the middle pattern layer 221 may be formed of, for example, silicon nitride, boron nitride, silicon boron nitride, phosphorus boron nitride, boron carbon silicon nitride, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the middle pattern layer 221 may be formed by, for example, chemical vapor deposition, physical vapor deposition, or other applicable deposition processes. The middle pattern layer 221 may be exposed through the regions R1, R2, R3, R4, R5, R6, R7. It should be noted that the bottom pattern layer 211 and the middle pattern layer 221 are not shown in FIG. 2 for clarity.

FIG. 5 illustrates, in a schematic top-view diagram, an intermediate semiconductor device in accordance with one embodiment of the present disclosure. FIGS. 6 to 8 are schematic cross-sectional view diagrams taken along lines A-A', B-B', and C-C' in FIG. 5 illustrating part of the flow for fabricating the semiconductor device 1A in accordance with one embodiment of the present disclosure.

With reference to FIG. 1 and FIGS. 5 to 8, at step S13, the bottom pattern layer 211 and the middle pattern layer 221 may be patterned by a plurality of primary mask layers 311 to form a primary bottom pattern layer 213 and a primary middle pattern layer 223, and a top pattern layer 231 may be formed to cover the primary bottom pattern layer 213 and the primary middle pattern layer 223.

With reference to FIGS. 5 and 6, the plurality of primary mask layers 311 may be formed on the middle pattern layer 221. In some embodiments, each of the plurality of primary mask layers 311 may be a linear cross-sectional profile and may extend along a second tilt direction D2 in a top-view perspective. That is, in a top-view perspective, the plurality of primary mask layers 311 may manifest a series of linear cross-sectional profiles, each extending along the second tilt direction D2 and spaced apart from one and other. These delineated profiles of the primary mask layers 311 may be collectively identified as the first pattern. The second tilt direction D2 may intersect with the first tilt direction D1. The first tilt direction D1 may intersect with the direction Y and the direction X.

In some embodiments, the plurality of primary mask layers 311 may be a photoresist layer. The first pattern of the plurality of primary mask layers 311 may be formed by performing a photolithography process. The un-patterned primary mask layer (not shown in FIGS. 5 and 6) may be exposed to process light according to a mask (not shown in FIGS. 5 and 6). A wavelength of the process light may be associated with the critical dimension of the pattern. In some embodiments, the process light may be a deep ultraviolet (DUV). In some embodiments, the process light may be an extreme ultraviolet (EUV), and the photolithography process may be an EUV lithography. After exposing the process light, the pattern on the mask is converted to the un-patterned primary mask layer. The un-patterned primary mask layer may be then etched according to the converted pattern so as to form the first pattern of the plurality of primary mask layers 311. In some embodiments, the plurality of primary mask layers 311 may be formed by multiple litho-etch (LE) patterning process, self-aligned double-patterning (SADP) process, self-aligned quadruple patterning (SAQP) process, self-aligned octuple patterning (SAOP) process, or other applicable photolithography processes.

With reference to FIGS. 5 and 6, the regions R1, R4, R7 may not be masked by the plurality of primary mask layers 311. In other words, the middle pattern layer 221 in the regions R1, R4, R7 may be exposed through spaces between adjacent pairs of the plurality of primary mask layers 311. In contrast, the regions R2, R3, R5, R6 may be masked by the plurality of primary mask layers 311. It should be noted that the bottom pattern layer 211 and the middle pattern layer 221 are not shown in FIG. 5 for clarity.

With reference to FIGS. 7, an etching process (also referred to as the first etching process) may be performed using the plurality of primary mask layers 311 as the mask to remove portions of the bottom pattern layer 211 and the middle pattern layer 221. After the first etching process, the bottom pattern layer 211 may be turned into a primary bottom pattern layer 213 and the middle pattern layer 221 may be turned into a primary middle pattern layer 223. Spaces 331 may be formed in the primary bottom pattern layer 213 and the primary middle pattern layer 223 to expose the plurality of pre-cutting regions PCA and the isolation layer 103. In some embodiments, the first etching process may be a multi-stage etching process. For example, the first etching process may be a two-stage anisotropic dry etching process. The etching chemistry may be different for each stage to provide different etching selectivity.

With reference to FIGS. 5 and 7, in regions R1, R4, the pre-cutting area PCA may be exposed through space 331. In regions R7, the isolation layer 103 may be exposed through space 331. In contrast, the regions R2, R3, R5, R6 are all masked by the plurality of primary mask layers 311; therefore, no pre-cutting area PCA or isolation layer 103 is exposed for those regions. It should be noted that the primary bottom pattern layer 213 and the primary middle pattern layer 223 are not shown in the FIG. 5 for clarity.

After the first etching process, the plurality of primary mask layers 311 may be removed.

With reference to FIG. 8, the top pattern layer 231 may be formed to cover the primary bottom pattern layer 213 and the primary middle pattern layer 223. The spaces 331 may be completely filled by the top pattern layer 231. In some embodiments, the top pattern layer 231 may be formed of a material having etching selectivity to the substrate 101 and the isolation layer 103. In some embodiments, the top pattern layer 231 may be formed of a material having etching selectivity to the substrate 101, the isolation layer 103, and the primary middle pattern layer 223. In some embodiments, the top pattern layer 231 may be formed of a material having etching selectivity to the substrate 101, the isolation layer 103, the primary middle pattern layer 223, and the primary bottom pattern layer 213. In some embodiments, the top pattern layer 231 may be formed of, for example, silicon nitride, boron nitride, silicon boron nitride, phosphorus boron nitride, boron carbon silicon nitride, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the top pattern layer 231 may be formed by, for example, chemical vapor deposition, physical vapor deposition, or other applicable deposition processes. In some embodiments, a planarization process, such as chemical mechanical polishing, may be performed to provide a substantially flat surface for subsequent processing steps.

It should be noted that the top pattern layer 231 is not shown in FIG. 5 for clarity.

Figure 10:
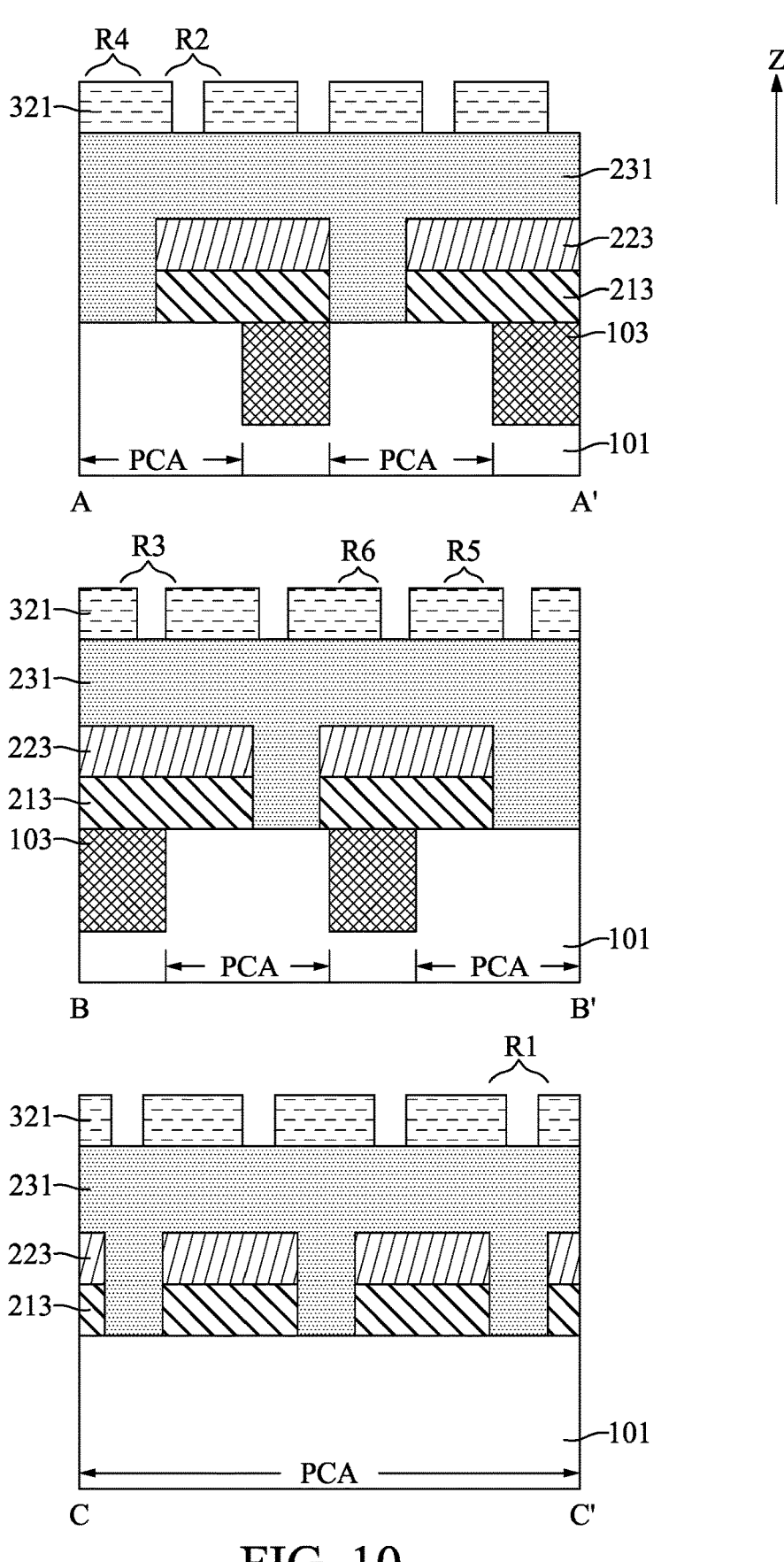
FIGS. 10 and 11 are schematic cross-sectional view diagrams taken along lines A-A', B-B', and C-C' in FIG. 9.
Figure 11:
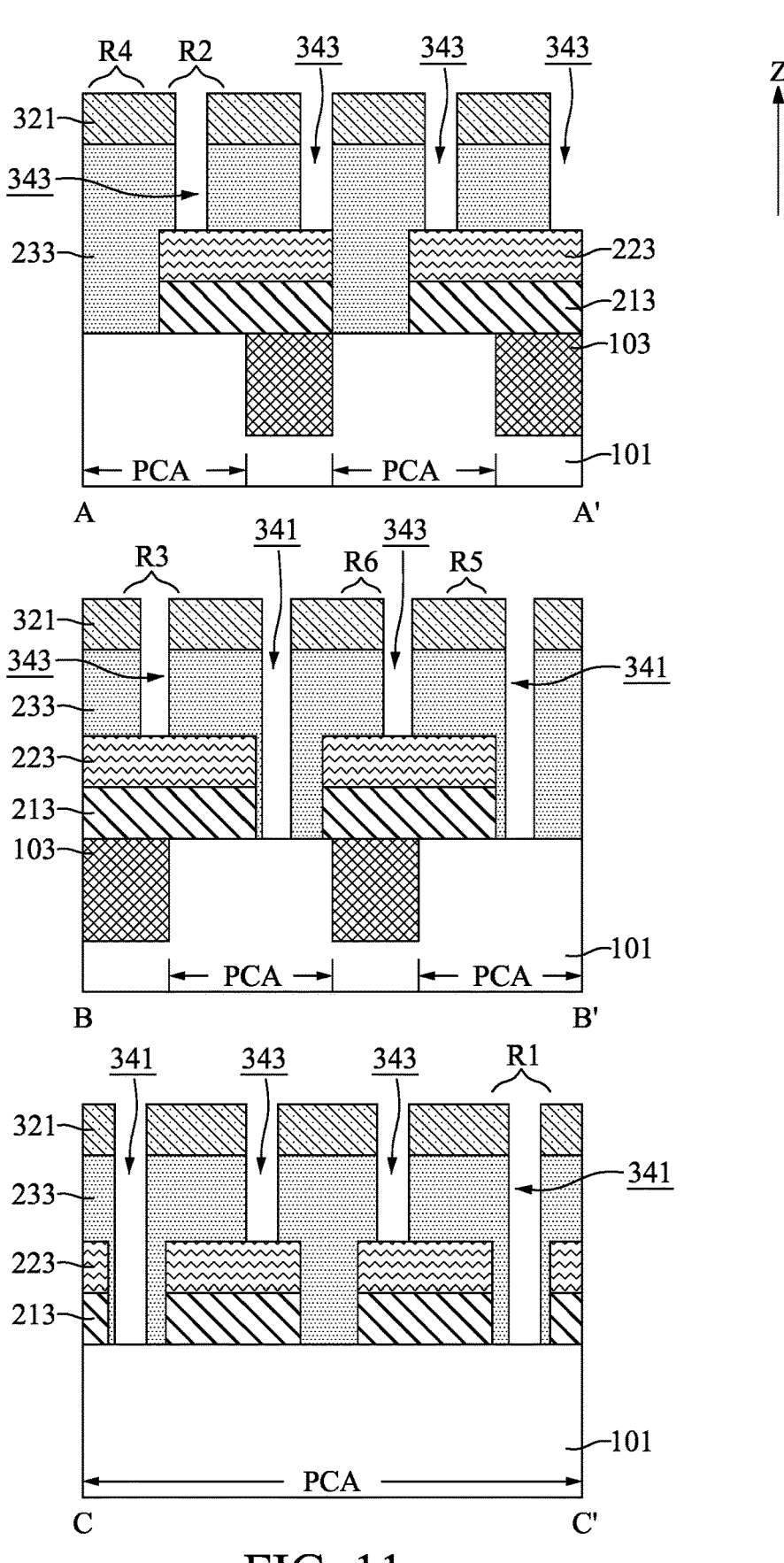
Figure 13:
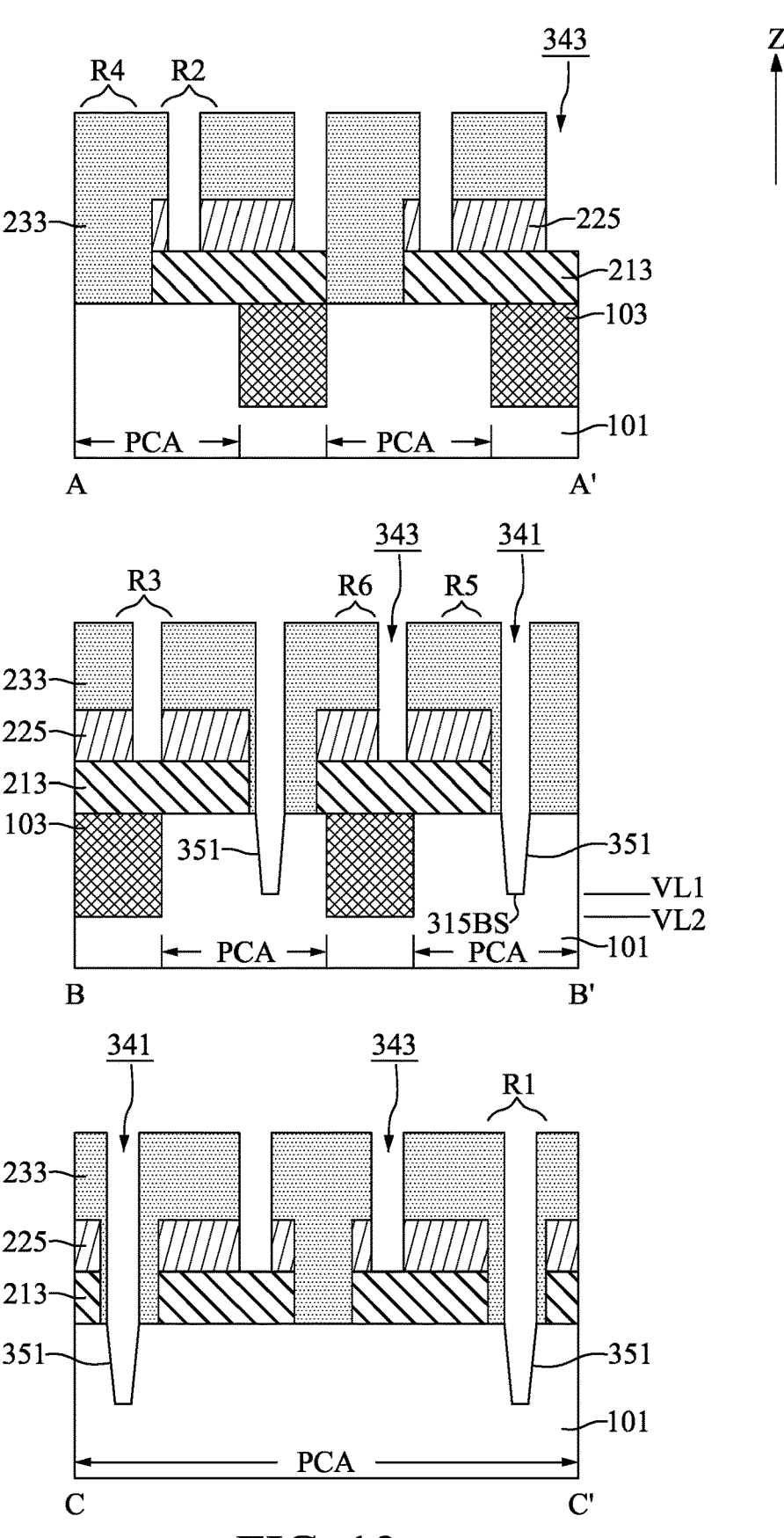
FIG. 13 is a schematic cross-sectional view diagrams taken along lines A-A', B-B', and C-C' in FIG. 12.

FIG. 9 illustrates, in a schematic top-view diagram, an intermediate semiconductor device in accordance with one embodiment of the present disclosure. FIGS. 10 and 11 are schematic cross-sectional view diagrams taken along lines A-A', B-B', and C-C' in FIG. 9 illustrating part of the flow for fabricating the semiconductor device 1A in accordance with one embodiment of the present disclosure. FIG. 12 illustrates, in a schematic top-view diagram, an intermediate semiconductor device in accordance with one embodiment of the present disclosure. FIG. 13 is a schematic cross-sectional view diagrams taken along lines A-A', B-B', and C-C' in FIG. 12 illustrating part of the flow for fabricating the semiconductor device 1A in accordance with one embodiment of the present disclosure.

With reference to FIG. 1 and FIGS. 9 to 13, at step S15, the top pattern layer 231 may be patterned by a plurality of secondary mask layers 321 to form a primary top pattern layer 233 including a plurality of first-type spaces 341 exposing the plurality of pre-cutting regions PCA and a plurality of second-type spaces 343 exposing the primary middle pattern layer 223, and the plurality of first-type spaces 341 may be deepened to form a plurality of first-type recesses 351 within the plurality of pre-cutting regions PCA.

With reference to FIGS. 9 and 10, the plurality of secondary mask layers 321 may be formed on the top pattern layer 231. In some embodiments, each of the plurality of secondary mask layers 321 may be a linear cross-sectional profile and may extend along direction Y in a top-view perspective. That is, in a top-view perspective, the plurality of secondary mask layers 321 may manifest a series of linear cross-sectional profiles, each extending along the direction Y and spaced apart from one and other. These delineated profiles of the secondary mask layers 321 may be collectively identified as the second pattern. In some embodiments, the second pattern may also be served as the pattern for word line structures.

In some embodiments, the plurality of secondary mask layers 321 may be a photoresist layer. The second pattern of the plurality of secondary mask layers 321 may be formed by performing a photolithography process. The un-patterned secondary mask layer (not shown in FIGS. 9 and 10) may be exposed to process light according to a mask (not shown in FIGS. 9 and 10). A wavelength of the process light may be associated with the critical dimension of the pattern. In some embodiments, the process light may be a DUV. In some embodiments, the process light may be an EUV, and the photolithography process may be an EUV lithography. After exposing the process light, the pattern on the mask is converted to the un-patterned secondary mask layer. The un-patterned secondary mask layer may be then etched according to the converted pattern so as to form the second pattern of the plurality of secondary mask layers 321. In some embodiments, the plurality of secondary mask layers 321 may be formed by multiple LE patterning process, SADP process, SAQP process, SAOP process, or other applicable photolithography processes.

With reference to FIGS. 9 and 10, the regions R1, R2, R3 may not be masked by the plurality of secondary mask layers 321. In other words, the top pattern layer 231 in the regions R1, R2, R3 may be exposed through spaces between adjacent pairs of the plurality of secondary mask layers 321. In contrast, the regions R4, R5, R6, R7 may be masked by the plurality of secondary mask layers 321. It should be noted that the top pattern layer 231 is not shown in FIG. 9 for clarity.

With reference to FIG. 11, an etching process (also referred to as the second etching process) may be performed using the plurality of secondary mask layers 321 as the mask to remove portions of the top pattern layer 231. After the second etching process, the top pattern layer 231 may be turned into a primary top pattern layer 233. The plurality of first-type spaces 341 may be formed in the primary top pattern layer 233 to expose the plurality of pre-cutting regions PCA. The plurality of second-type spaces 343 may be formed in the primary top pattern layer 233 to expose the primary middle pattern layer 223.

In the region R1, the pre-cutting area PCA may be exposed through the first-type space 341. In the regions R2, R3, the primary middle pattern layer 223 may be exposed through the plurality of second-type spaces 343. In the regions R4, R5, R6, R7, the primary top pattern layer 233 may be masked by the plurality of secondary mask layers 321. In some embodiments, the second etching process may be an anisotropic dry etching process.

After the second etching process, the plurality of secondary mask layers 321 may be removed.

With reference to FIGS. 12 and 13, the plurality of first-type spaces 341 may be deepened toward the substrate 101 to form a plurality of first-type recesses 351 in the plurality of pre-cutting regions PCA. In some embodiments, the sidewalls of the plurality of first-type recesses 351 may be tapered. In some embodiments, the bottom surfaces 351BS of the plurality of first-type recesses 351 may be at the vertical level VL1 higher than the vertical level VL2 of the bottom surface 103BS of the isolation layer 103.

In some embodiments, the formation of the plurality of first-type recesses 351 may be achieved by an etching process (also referred to as the third etching process). In some embodiments, the primary middle pattern layer 223 exposed through the plurality of second-type spaces 343 may be also removed during the third etching process. After the third etching process, the plurality of second-type spaces 343 may penetrate the primary middle pattern layer 223 and turned the primary middle pattern layer 223 into a secondary middle pattern layer 225. In some embodiments, the primary bottom pattern layer 213 may serve as an etching stop layer or an end point for the third etching process.

With reference to FIGS. 12 and 13, in the region R1, the first-type recess 351 may be exposed through the first-type space 341. In the regions R2, R3, the primary bottom pattern layer 213 may be exposed through the second-type space 343. In the regions R4, R5, R6, R7, the underlying layers (i.e., the secondary middle pattern layer 225, the primary bottom pattern layer 213, the pre-cutting area PCA, or the isolation layer 103) may be covered by the primary top pattern layer 233.

Figure 15:
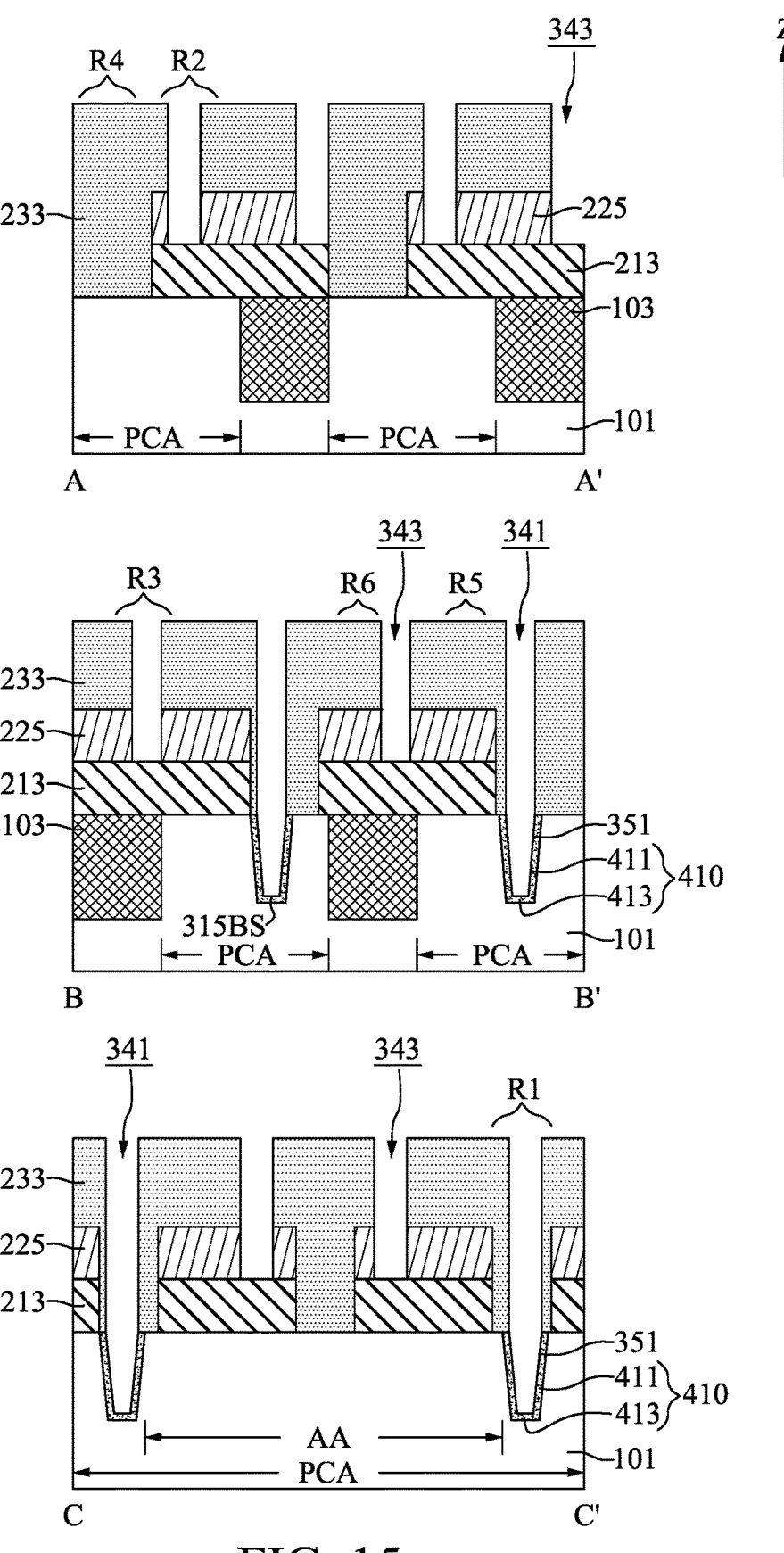
FIG. 15 is a schematic cross-sectional view diagram taken along lines A-A', B-B', and C-C' in FIG. 14.
Figure 17:
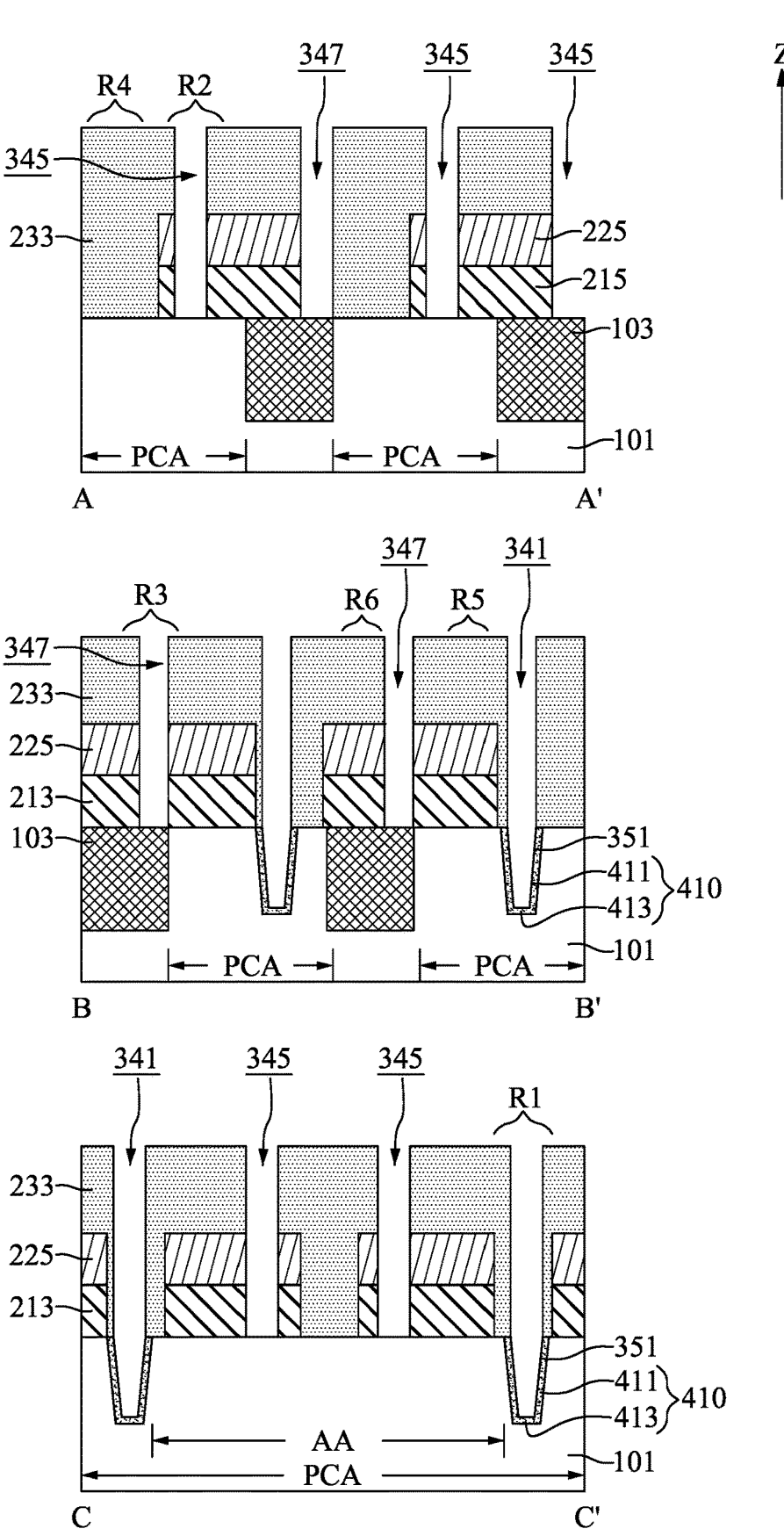
FIG. 17 is a schematic cross-sectional view diagram taken along lines A-A', B-B', and C-C' in FIG. 16.

FIG. 14 illustrates, in a schematic top-view diagram, an intermediate semiconductor device in accordance with one embodiment of the present disclosure. FIG. 15 is a schematic cross-sectional view diagram taken along lines A-A', B-B', and C-C' in FIG. 14 illustrating part of the flow for fabricating the semiconductor device 1A in accordance with one embodiment of the present disclosure. FIG. 16 illustrates, in a schematic top-view diagram, an intermediate semiconductor device in accordance with one embodiment of the present disclosure. FIG. 17 is a schematic cross-sectional view diagram taken along lines A-A', B-B', and C-C' in FIG. 16 illustrating part of the flow for fabricating the semiconductor device 1A in accordance with one embodiment of the present disclosure.

With reference to FIG. 1 and FIGS. 14 to 17, at step S17, a plurality of primary cutting insulating layers 410 may be formed along the plurality of first-type recesses 351 to define a plurality of active areas AA, and the plurality of second-type spaces 343 may be deepened to expose the plurality of pre-cutting regions PCA and the isolation layer 103.

With reference to FIGS. 14 and 15, an oxidation process may be performed to oxidize the sidewalls and bottom surfaces 351BS of the plurality of first-type recesses 351. In some embodiments, the oxidation process may be a wet oxidation process. After the oxidation process, the oxidized portions of the substrate 101 may be referred to as the plurality of primary cutting insulating layers 410. Each of the plurality of primary cutting insulating layer 410 may include a bottom portion 413 and two side portions 411. The side portions 411 may be formed along the sidewalls of the first-type recess 351. The bottom portion 413 may be formed along the bottom surfaces 351BS of the first-type recess 351. In some embodiments, the plurality of primary cutting insulating layer 410 may include silicon oxide.

For the plurality of primary cutting insulating layers 410 formed within the same pre-cutting area PCA, each adjacent pair of the primary cutting insulating layers 410 defines an active area AA.

With reference to FIGS. 14 and 15, in the region R1, the bottom portion 413 and part of the side portion 411 may be exposed through the first-type space 341. In the region R2, the primary bottom pattern layer 213 may be exposed through the second-type space 343 and the pre-cutting area PCA may be covered by the primary bottom pattern layer 213. In the region R3, the primary bottom pattern layer 213 may be exposed through the second-type space 343 and the isolation layer 103 may be covered by the primary bottom pattern layer 213. In the region R4, the pre-cutting area PCA may be covered by the primary top pattern layer 233. In the region R5, the primary top pattern layer 233 may be formed over the secondary middle pattern layer 225, the primary bottom pattern layer 213, and the pre-cutting area PCA. In region R6, the primary top pattern layer 233 may be formed over the secondary middle pattern layer 225, the primary bottom pattern layer 213, and the isolation layer 103. In the region R7, the isolation layer 103 may be covered by the primary top pattern layer 233.

With reference to FIGS. 16 and 17, the plurality of second-type spaces 343 may be deepened by removing portions of the primary bottom pattern layer 213. The deepening of the plurality of second-type spaces 343 may be achieved by an etching process (also referred to as the fourth etching process) such as an anisotropic dry etching process. After the fourth etching process, the primary bottom pattern layer 213 may be turned into a secondary bottom pattern layer 215. The plurality of second-type spaces 343 may be turned into a plurality of third-type spaces 345 exposing the plurality of pre-cutting regions PCA and a plurality of fourth-type spaces 347 exposing the isolation layer 103.

With reference to FIGS. 16 and 17, in the region R1, the primary cutting insulating layer 410 may be exposed through the first-type space 341. In the region R2, the pre-cutting area PCA may be exposed through the third-type space 345. In the region R3, the isolation layer 103 may be exposed through the fourth-type space 347. The film composition for the regions R5, R6, R7 are the same as that illustrated in FIGS. 14 and 15, and descriptions thereof are not repeated herein.

Figure 19:
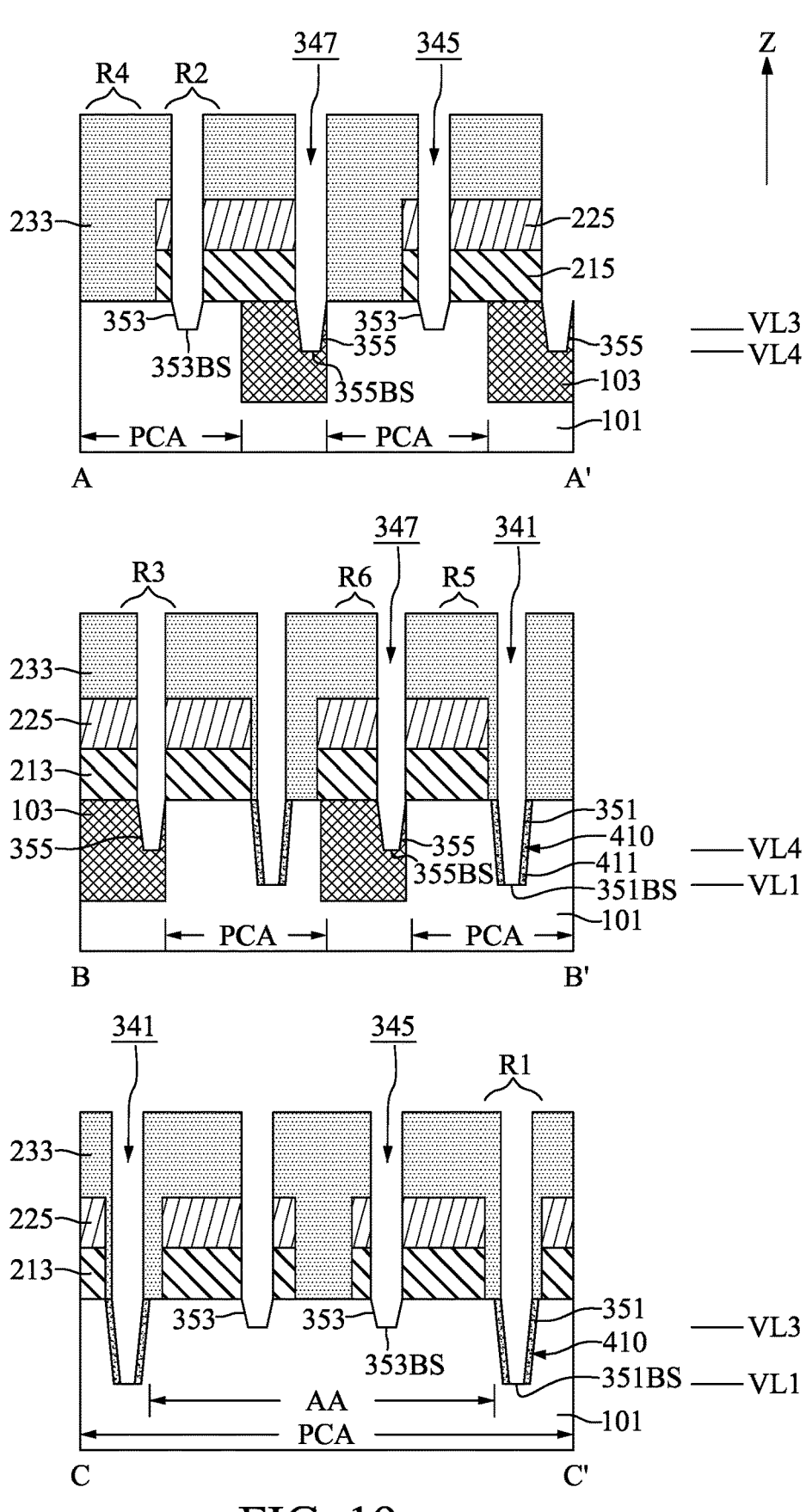
Figure 20:
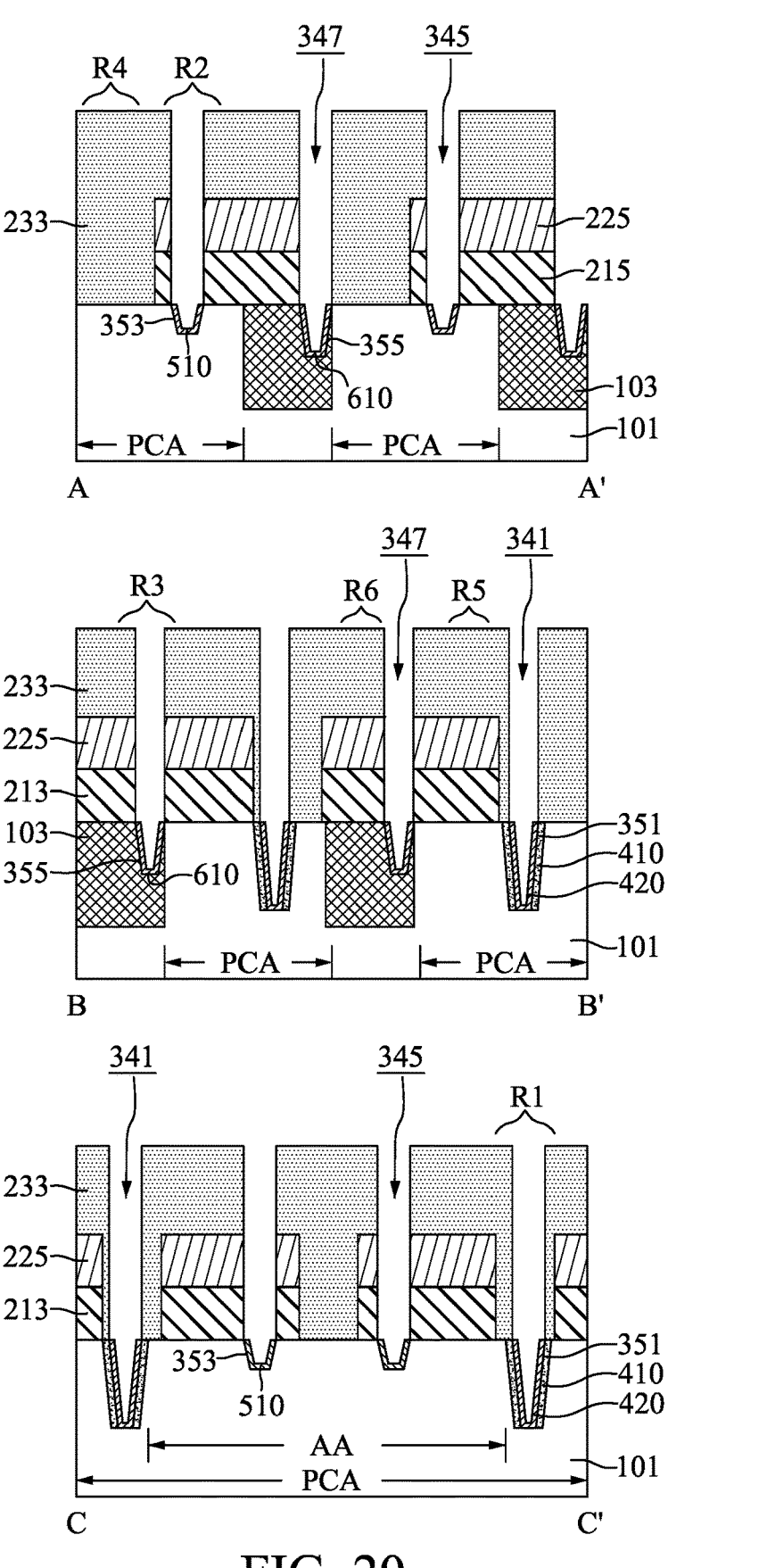
Figure 22:
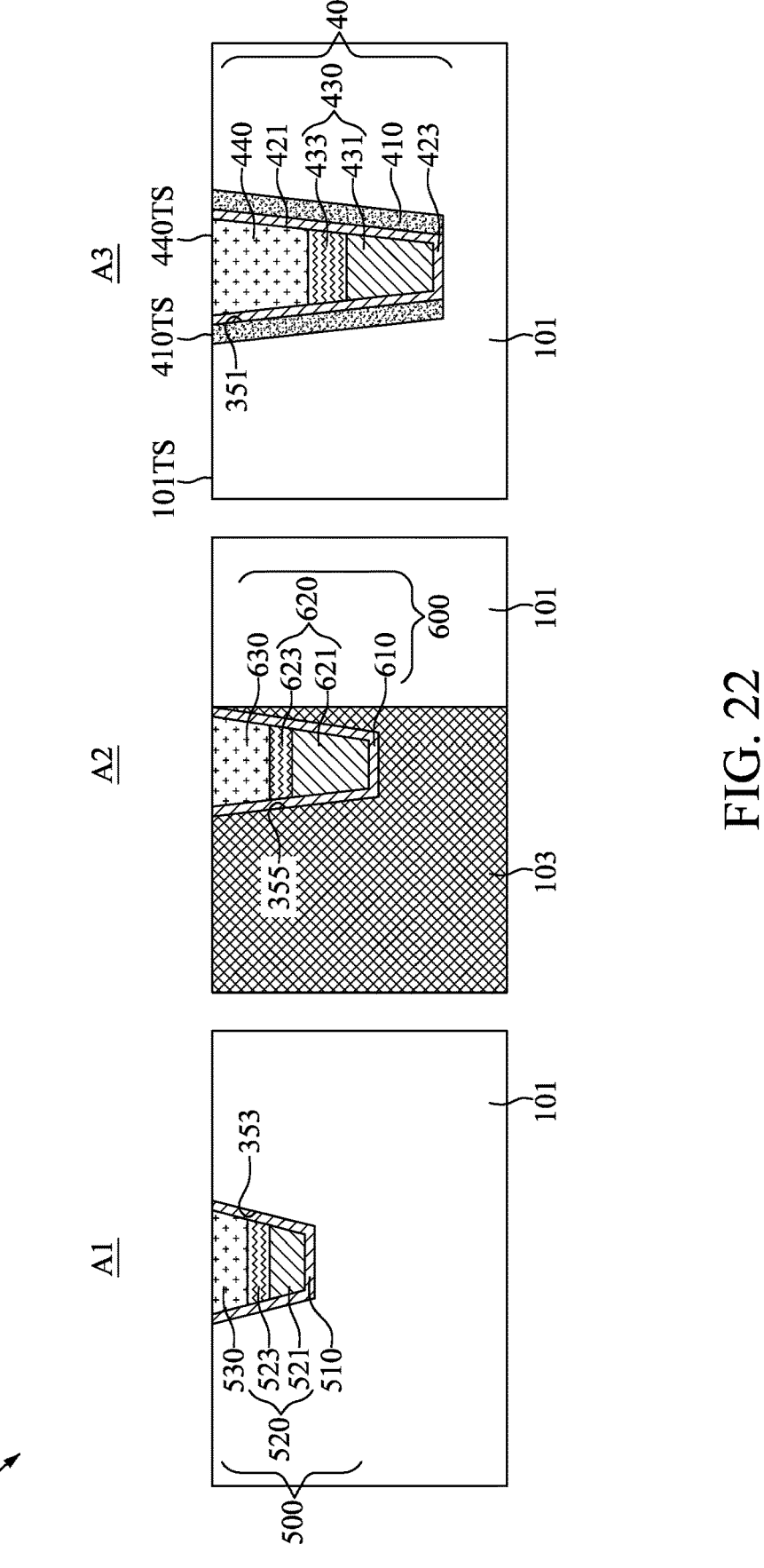
FIG. 22 is a schematic close-up cross-sectional view diagram for areas A1, A2, and A3 in FIG. 21.

FIG. 18 illustrates, in a schematic top-view diagram, an intermediate semiconductor device in accordance with one embodiment of the present disclosure. FIGS. 19 to 21 are schematic cross-sectional view diagrams taken along lines A-A', B-B', and C-C' in FIG. 18 illustrating part of the flow for fabricating the semiconductor device 1A in accordance with one embodiment of the present disclosure. FIG. 22 is a schematic close-up cross-sectional view diagram for areas A1, A2, and A3 in FIG. 21 in accordance with one embodiment of the present disclosure.

With reference to FIG. 1 and FIGS. 18 to 22, at step S19, a plurality of second-type recesses 353 may be formed in the plurality of pre-cutting regions PCA, a plurality of third-type recesses 355 may be formed in the isolation layer 103, a plurality of first word line (WL) structures 500 may be formed in the plurality of second-type recesses 353, a plurality of second word line (WL) structures 600 may be formed in the plurality of third-type recesses 355, and a plurality of cutting structures 400 may be formed in the plurality of first-type recesses 351.

With reference to FIGS. 18 and 19, an etching process (also referred to as the fifth etching process) may be performed to deepen the plurality of third-type spaces 345 and the plurality of fourth-type spaces 347. After the fifth etching process, the plurality of third-type spaces 345 may be deepened to form the plurality of second-type recesses 353 within the plurality of active areas AA. The plurality of fourth-type spaces 347 may be deepened to form the plurality of third-type recesses 355 within the isolation layer 103. In some embodiments, the fifth etching process may be an anisotropic dry etching process. In some embodiments, the bottom surfaces 353BS of the plurality of second-type recesses 353 may be at the vertical level VL3 higher than the vertical level VL4 of the bottom surfaces 355BS of the plurality of third-type recesses 355.

In some embodiments, the bottom portion 413 of the primary cutting insulating layer 410 may be consumed during the fourth etching process. That is, the primary cutting insulating layer 410 may only include the side portion 411 after the fifth etching process. The bottom surfaces 351BS of the plurality of first-type recesses 351 may be exposed after the fourth etching process. In some embodiments, the bottom surfaces 351BS of the plurality of first-type recesses 351 may be at the vertical level VL1 lower than the vertical level VL3 of the bottom surfaces 353BS of the plurality of second-type recesses 353 and the vertical level VL4 of the bottom surfaces 355BS of the plurality of third-type recesses 355.

With reference to FIGS. 18 and 19, in the region R1, the bottom surface 351BS of the first-type recess 351 and the primary cutting insulating layer 410 may be exposed through the first-type space 341. In the region R2, the bottom surface 353BS of the second-type recess 353 may be exposed through the third-type space 345. In the region R3, the bottom surface 355BS of the third-type recess 355 may be exposed through the fourth-type space 347. The film composition for the regions R4, R5, R6, R7 are the same as that illustrated in FIGS. 16 and 17, and descriptions thereof are not repeated herein.

With reference to FIG. 20, a plurality of secondary cutting insulating layers 420 may be conformally formed in the plurality of first-type recesses 351, a plurality of first WL dielectric layers 510 may be conformally formed in the plurality of second-type recesses 353, and a plurality of second WL dielectric layers 610 may be conformally formed in the plurality of third-type recesses 355. In some embodiments, the secondary cutting insulating layer 420, the first WL dielectric layer 510, and the second WL dielectric layer 610 may have a U-shaped cross-sectional profile.

In some embodiments, the secondary cutting insulating layers 420, the first WL dielectric layers 510, and the second WL dielectric layers 610 may be concurrently formed. In some embodiments, the secondary cutting insulating layers 420, the first WL dielectric layers 510, and the second WL dielectric layers 610 may be formed of, for example, a high-k material, an oxide, a nitride, an oxynitride or combinations thereof. In some embodiments, the secondary cutting insulating layers 420, the first WL dielectric layers 510, and the second WL dielectric layers 610 may be formed by, for example, atomic layer deposition, chemical vapor deposition, or other applicable deposition processes.

In some embodiments, the high-k dielectric material may include a hafnium-containing material. The hafnium-containing material may be, for example, hafnium oxide, hafnium silicon oxide, hafnium silicon oxynitride, or a combination thereof. In some embodiments, the high-k dielectric material may be, for example, lanthanum oxide, lanthanum aluminum oxide, zirconium oxide, zirconium silicon oxide, zirconium silicon oxynitride, aluminum oxide or a combination thereof.

In some embodiments, the secondary cutting insulating layers 420, the first WL dielectric layers 510, and the second WL dielectric layers 610 may be formed before the primary top pattern layer 233, the secondary middle pattern layer 225, and the secondary bottom pattern layer 215 are removed. In some embodiments, the secondary cutting insulating layers 420, the first WL dielectric layers 510, and the second WL dielectric layers 610 may be formed after the primary top pattern layer 233, the secondary middle pattern layer 225, and the secondary bottom pattern layer 215 are removed (not shown in FIG. 20).

With reference to FIG. 20, in the region R1, the secondary cutting insulating layer 420 may be exposed through the first-type space 341. In the region R2, the first WL dielectric layer 510 may be exposed through the third-type space 345. In the region R3, the second WL dielectric layer 610 may be exposed through the fourth-type space 347. The film composition for the regions R4, R5, R6, R7 are the same as that illustrated in FIGS. 16 and 17, and descriptions thereof are not repeated herein.

For brevity, clarity, and convenience of description, only one first WL structure 500, one second WL structure 600, and one cutting structure 400 is described. The cutting structure 400 may include the primary cutting insulating layer 410, the secondary cutting insulating layer 420, a conductive portion 430, and a capping portion 440. The first WL structure 500 may include the first WL dielectric layer 510, a first WL conductive layer 520, and a first WL capping layer 530. The second WL structure 600 may include the second WL dielectric layer 610, a second WL conductive layer 620, and a second WL capping layer 630.

With reference to FIGS. 21 and 22, in some embodiments, the primary top pattern layer 233, the secondary middle pattern layer 225, and the secondary bottom pattern layer 215 may be removed. The conductive portion 430 may be formed within the first-type recess 351 and on the secondary cutting insulating layer 420. In some embodiments, the conductive portion 430 may include a bottom segment 431 and a top segment 433. The bottom segment 431 may be disposed on the bottom portion 423 of the secondary cutting insulating layer 420 and surrounded by the side portions 421 of the secondary cutting insulating layer 420. In some embodiments, the bottom segment 431 may be formed of, for example, tungsten, cobalt, zirconium, tantalum, aluminum, ruthenium, copper, metal carbides (e.g., tantalum carbide, titanium carbide, tantalum magnesium carbide), transition metal aluminides, or a combination thereof. The top segment 433 may be disposed on the bottom segment 431 and surrounded by the side portions 421 of the secondary cutting insulating layer 420. In some embodiments, the top segment 433 may be formed of, for example, polycrystalline silicon, polycrystalline germanium, polycrystalline silicon germanium, doped polycrystalline silicon, doped polycrystalline germanium, doped polycrystalline silicon germanium, or a combination thereof.

In some embodiments, the first WL conductive layer 520 may include a bottom portion 521 and a top portion 523. The bottom portion 521 may be formed on the first WL dielectric layer 510 and within the second-type recess 353. The top portion 523 may be formed on the bottom portion 521. The sidewalls of the bottom portion 521 and the top portion 523 may be surrounded by the first WL dielectric layer 510.

In some embodiments, the second WL conductive layer 620 may include a bottom portion 621 and a top portion 623. The bottom portion 621 may be formed on the second WL dielectric layer 610 and within the third-type recess 355. The top portion 623 may be formed on the bottom portion 621. The sidewalls of the bottom portion 621 and the top portion 623 may be surrounded by the second WL dielectric layer 610.

In some embodiments, the conductive portion 430, the first WL conductive layer 520, and the first WL capping layer 530 may be concurrently formed and may be formed of the same material.

With reference to FIGS. 21 and 22, in some embodiments, the capping portion 440 may be formed on the conductive portion 430 and within the first-type recess 351. In some embodiments, the top surface 440TS of the capping portion 440, the top surface 410TS of the primary cutting insulating layer 410, and the top surface 101TS of the substrate 101 (i.e., the top surface of the pre-cutting area PCA or the active area AA) may be substantially coplanar. In some embodiments, the capping portion 440 may be formed of, for example, silicon nitride or other applicable dielectric materials.

In some embodiments, the first WL capping layer 530 may be formed on the first WL conductive layer 520 and within the second-type recess 353. The sidewalls of the first WL capping layer 530 may be surrounded by the first WL dielectric layer 510. In some embodiments, the second WL capping layer 630 may be formed on the second WL conductive layer 620 and within the third-type recess 355. The sidewalls of the second WL capping layer 630 may be surrounded by the second WL dielectric layer 610. In some embodiments, the capping portion 440, the first WL capping layer 530, and the second WL capping layer 630 may be concurrently formed and may be formed of the same material.

In some embodiments, the primary top pattern layer 233, the secondary middle pattern layer 225, and the secondary bottom pattern layer 215 may be removed after the formation of the capping portion 440.

Figure 23:
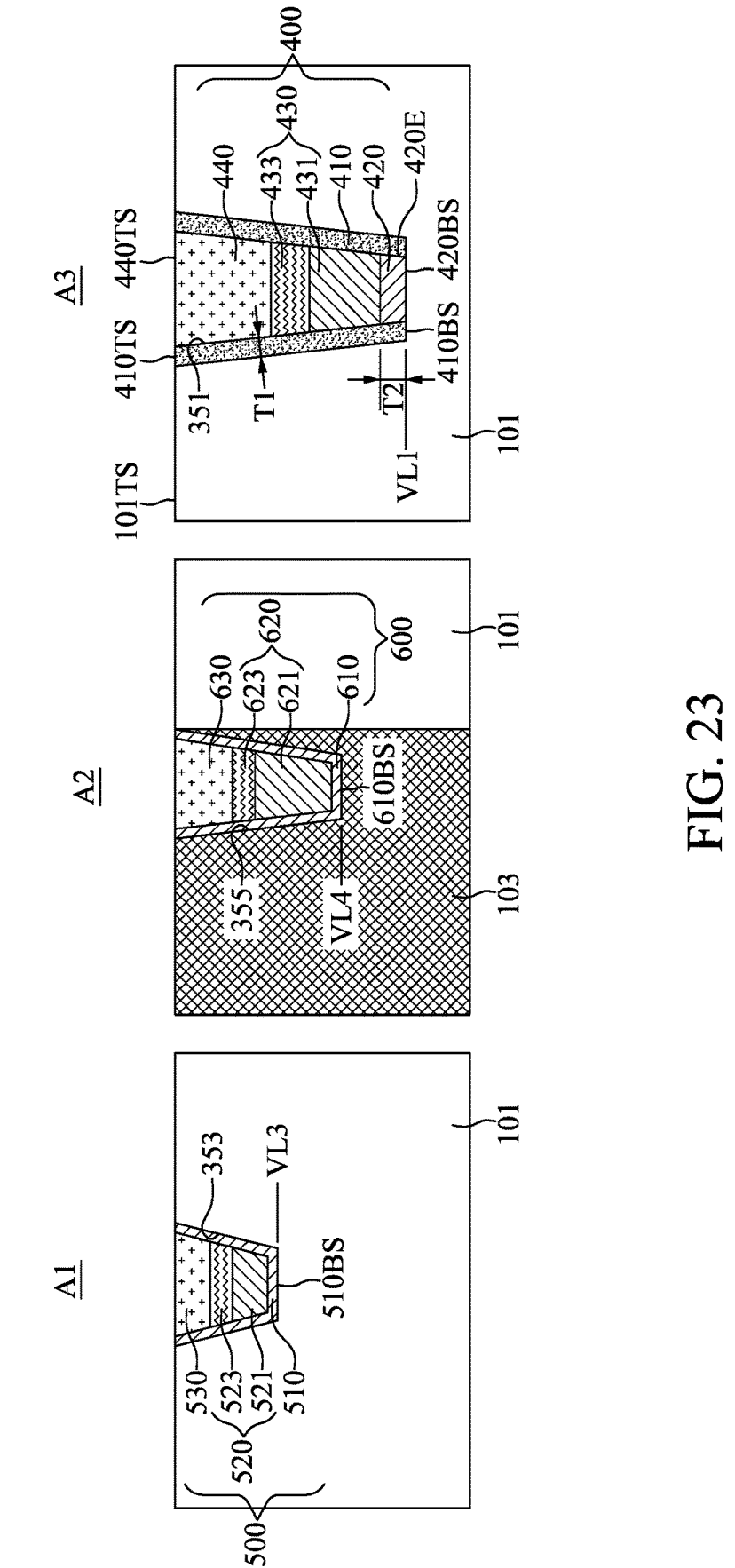
Figure 24:
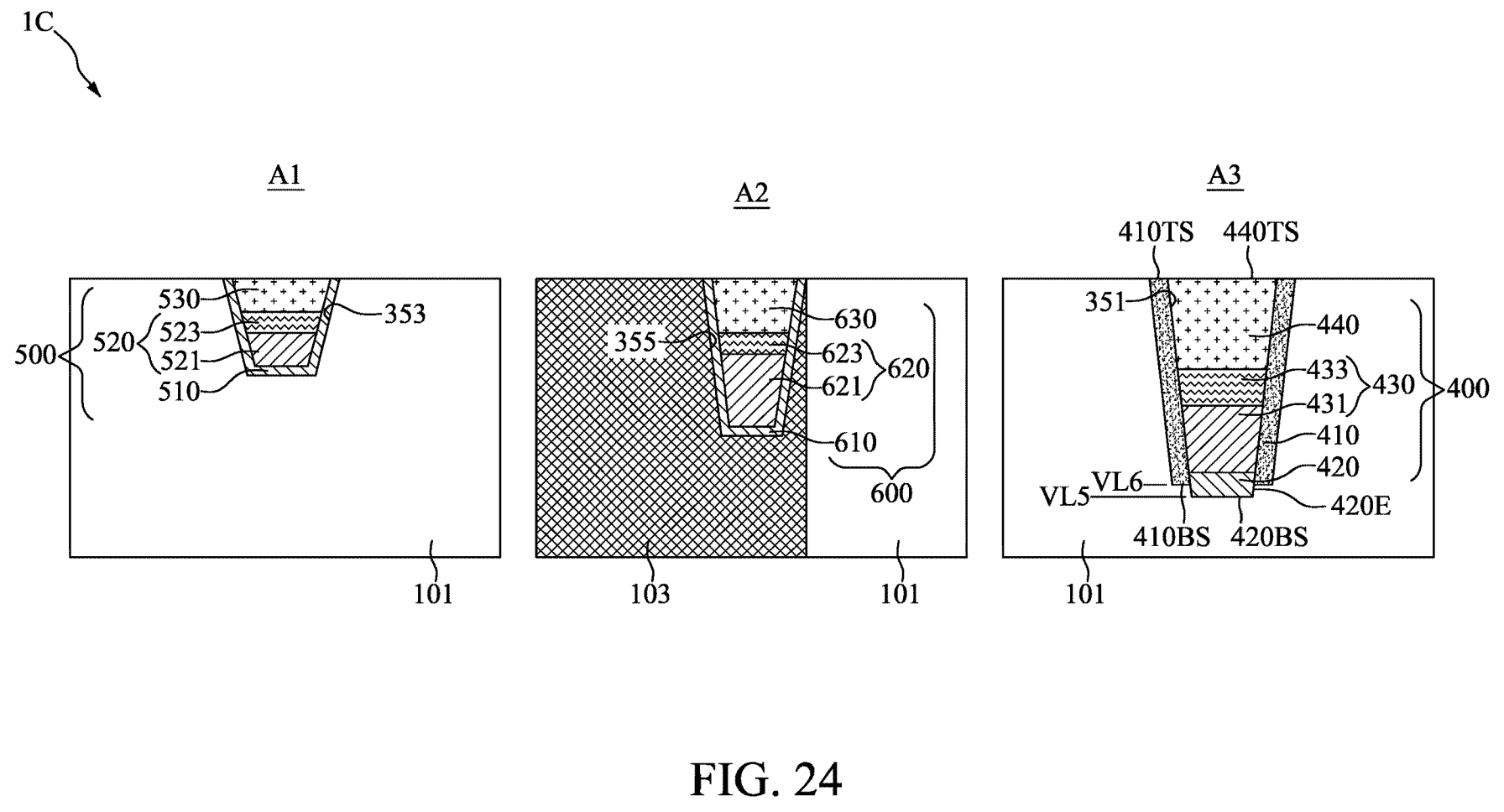

FIGS. 23 and 24 illustrate, in schematic close-up cross-sectional view diagrams, semiconductor devices 1B and 1C in accordance with some embodiments of the present disclosure.

With reference to FIG. 23, the semiconductor device 1B may have a structure similar to that illustrated in FIG. 22. The same or similar elements in FIG. 23 as in FIG. 22 have been marked with similar reference numbers and duplicative descriptions have been omitted.

In the semiconductor device 1B, the secondary cutting insulating layer 420 may only be disposed on the bottom of the first-type recess 351 due to different deposition rates at the bottom and sidewall of the first-type recess 351 during the formation of the secondary cutting insulating layer 420. The two primary cutting insulating layers 410 may be disposed on two ends 420E of the secondary cutting insulating layer 420 and extending upward. The two primary cutting insulating layers 410 and the secondary cutting insulating layer 420 together configure a U-shaped cross-sectional profile. The bottom surfaces 410BS of the two primary cutting insulating layers and the bottom surface 420BS of the secondary cutting insulating layer 420 may be substantially coplanar.

In some embodiments, the thickness T1 of the primary cutting insulating layer 410 and the thickness T2 of the secondary cutting insulating layer 420 may be substantially the same. In some embodiments, thickness T1 of the primary cutting insulating layer 410 and the thickness T2 of the secondary cutting insulating layer 420 may be different. The thicknesses T1, T2 of the primary cutting insulating layer 410 and the secondary cutting insulating layer 420 may determine the insulation capability of the cutting structure 400.

In some embodiments, the bottom surfaces 510BS of the first WL dielectric layer 510 may be at the vertical level VL3 higher than the vertical level VL4 of the bottom surfaces 610BS of the second WL dielectric layer 610. In some embodiments, the bottom surfaces 420BS of the secondary cutting insulating layer 420 may be at the vertical level VL1 lower than the vertical level VL3 of the bottom surfaces 510BS of the first WL dielectric layer 510 and the vertical level VL4 of the bottom surfaces 610BS of the second WL dielectric layer 610.

The conductive portion 430 may be disposed on the secondary cutting insulating layer 420 and laterally surrounded by the two primary cutting insulating layers 410. Detailedly, the bottom segment 431 may be disposed on the secondary cutting insulating layer 420 and be laterally surrounded by the two primary cutting insulating layers 410. The top segment 433 may be disposed on the bottom segment 431 and be laterally surrounded by the two primary cutting insulating layers 410. The capping portion 440 may be disposed on the conductive portion 430 and laterally surrounded by the two primary cutting insulating layers 410.

With reference to FIG. 24, the semiconductor device 1C may have a structure similar to that illustrated in FIG. 23. The same or similar elements in FIG. 24 as in FIG. 23 have been marked with similar reference numbers and duplicative descriptions have been omitted.

In semiconductor device 1C, some substrate 101 adjacent to the bottom of the first-type recess 351 may also be removed during the etching process as illustrated in FIGS. 18 and 19. As a result, the secondary cutting insulating layer 420 may be formed at a lower position compared to FIG. 23. For example, the bottom surface 420BS of the secondary cutting insulating layer 420 may be at the vertical level VL5 lower than the vertical level VL6 of the bottom surface 410BS of the primary cutting insulating layer 410.

One aspect of the present disclosure provides a cutting structure including two primary cutting insulating layers positioned on two ends of a secondary cutting insulating layer and extending upwardly, wherein the two primary cutting insulating layers and the secondary cutting insulating layer together configure a U-shaped cross-sectional profile; a conductive portion positioned on the secondary cutting insulating layer and laterally surrounded by the two primary cutting insulating layers; and a capping portion positioned on the conductive portion and laterally surrounded by the two primary cutting insulating layers.

Another aspect of the present disclosure provides a semiconductor device including an isolation layer positioned in a substrate to define a pre-cutting area along a first tilt direction in a top-view perspective; at least two cutting structures positioned in the pre-cutting area and respectively comprising two primary cutting insulating layers positioned on two ends of a secondary cutting insulating layer and extending upwardly, a conductive portion positioned on the secondary cutting insulating layer and laterally surrounded by the two primary cutting insulating layers, and a capping portion positioned on the conductive portion and laterally surrounded by the two primary cutting insulating layers. The two primary cutting insulating layers and the secondary cutting insulating layer together configure a U-shaped cross-sectional profile. An active area is defined within the pre-cutting area by an adjacent pair of the cutting structures.

Another aspect of the present disclosure provides a method for fabricating a semiconductor device including forming an isolation layer in a substrate to define a pre-cutting area, which extends along a first tilt direction in a top-view perspective, forming a bottom pattern layer on the substrate, and forming a middle pattern layer on bottom pattern layer; patterning the bottom pattern layer and the middle pattern layer using a primary mask layer, which extends along a second tilt direction in a top-view perspective, resulting in a primary bottom pattern layer and a primary middle pattern layer, which expose the pre-cutting area; forming a top pattern layer to cover the primary bottom pattern layer, the primary middle pattern layer, and the pre-cutting area; patterning the top pattern layer using a secondary mask layer, which extends along a first direction intersecting both the first tilt direction and the second tilt direction, resulting in a primary top pattern layer comprising at least two first-type spaces exposing the pre-cutting area and a second-type space exposing the primary middle pattern layer; and deepening the first-type spaces to form at least two first-type recesses in the pre-cutting area and forming at least two cutting structures in the first-type recesses. The first tilt direction intersects with the second tilt direction and an active area is defined within the pre-cutting area by an adjacent pair of the cutting structures.

Due to the design of the semiconductor device of the present disclosure, the formation of the cutting structures 400 and the active areas AA may be integrated with the formation of the word line structures 500, 600. This integration reduces the complexity and cost of fabricating the semiconductor devices 1A, 1B, 1C. Additionally, by meticulously controlling the process parameters for the primary cutting insulating layers 410 and the secondary cutting insulating layers 420, well-controlled insulation capability of the cutting structures 400 may be achieved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

16

What is claimed is:

1. A method for fabricating a semiconductor device, comprising:
   forming an isolation layer in a substrate to define a pre-cutting area, which extends along a first tilt direction in a top-view perspective, forming a bottom pattern layer on the substrate, and forming a middle pattern layer on bottom pattern layer;
   patterning the bottom pattern layer and the middle pattern layer using a primary mask layer, which extends along a second tilt direction in a top-view perspective, resulting in a primary bottom pattern layer and a primary middle pattern layer, which expose the pre-cutting area;
   forming a top pattern layer to cover the primary bottom pattern layer, the primary middle pattern layer, and the pre-cutting area;
   patterning the top pattern layer using a secondary mask layer, which extends along a first direction intersecting both the first tilt direction and the second tilt direction, resulting in a primary top pattern layer comprising at least two first-type spaces exposing the pre-cutting area and a second-type space exposing the primary middle pattern layer; and
   deepening the first-type spaces to form at least two first-type recesses in the pre-cutting area and forming at least two cutting structures in the first-type recesses;
   wherein the first tilt direction intersects with the second tilt direction and an active area is defined within the pre-cutting area by an adjacent pair of the cutting structures.

2. The method for fabricating the semiconductor device of claim 1, wherein forming the cutting structures comprises:
   conformally forming at least two primary cutting insulating layer along the first-type recesses;
   deepening the second-type space to form a second-type recess in the active area and a third-type recess in the isolation layer while removing at least two bottom portions of the primary cutting insulating layers to expose the pre-cutting area and leave side portions along the first-type recesses;
   forming at least two secondary cutting insulating layers in the first-type recesses and covering the pre-cutting area;
   forming at least two conductive portions on the secondary cutting insulating layers, within the first-type recesses, and laterally surrounded by the side portions; and
   forming at least two capping portions on the conductive portions, within the first-type recesses, and laterally surrounded by the side portions;
   wherein the primary cutting insulating layers, the secondary cutting insulating layers, the conductive portions, and the capping portions configure the cutting structures.

3. The method for fabricating the semiconductor device of claim 2, further comprising forming a first word line structure in the second-type recess.

4. The method for fabricating the semiconductor device of claim 3, further comprising forming a second word line word line structure in the third-type recess.

5. The method for fabricating the semiconductor device of claim 4, wherein forming the first word line structure in the second-type recess comprises:
   conformally forming a first word line dielectric layer in the second-type recess while forming the secondary cutting insulating layers;
   forming a first word line conductive layer on the first word line dielectric layer and within the second-type recess while forming the conductive portions; and forming a first word line capping layer on the first word line conductive layer and within the second-type recess while forming the capping portions.

6. The method for fabricating the semiconductor device of claim 4, wherein forming the second word line structure in the third-type recess comprises:

conformally forming a second word line dielectric layer in the third-type recess while forming the secondary cutting insulating layers;

forming a second word line conductive layer on the second word line dielectric layer and within the third-type recess while forming the conductive portions; and forming a second word line capping layer on the second word line conductive layer and within the third-type recess while forming the capping portions.

7. The method for fabricating the semiconductor device of claim 2, wherein the primary cutting insulating layers and the secondary cutting insulating layers comprise the same material.

8. The method for fabricating the semiconductor device of claim 2, wherein the primary cutting insulating layers and the secondary cutting insulating layers comprise different materials.

9. The method for fabricating the semiconductor device of claim 5, wherein the first word line conductive layer comprises a bottom portion on the first word line dielectric layer and a top portion on the bottom portion.

10. The method for fabricating the semiconductor device of claim 6, wherein the second word line conductive layer comprises a bottom portion on the second word line dielectric layer and a top portion on the bottom portion.

11. The method for fabricating the semiconductor device of claim 2, wherein the second-type recess is shallower than the third-type recess.

12. The method for fabricating the semiconductor device of claim 2, wherein the third-type recess is shallower than the first-type recess.

\* \* \* \* \*